(12) United States Patent  
Blin et al.

(10) Patent No.: US 12,407,306 B2
(45) Date of Patent: Sep. 2, 2025

(54) RADIO FREQUENCY FRONT END WITH INTEGRATED CHANNEL MATCHING CALIBRATION

(71) Applicant: Skyworks Solutions, Inc., Irvine, CA (US)

(72) Inventors: Guillaume Alexandre Blin, Carlisle, MA (US); Bang Li Liang, Ottawa (CA); Thomas Obkircher, Santa Ana, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 456 days.

(21) Appl. No.: 17/817,453

(22) Filed: Aug. 4, 2022

(65) Prior Publication Data

US 2023/0038733 A1    Feb. 9, 2023

Related U.S. Application Data

(60) Provisional application No. 63/203,913, filed on Aug. 4, 2021.

(51) Int. Cl.
| | |
|---|---|
| *H03F 3/19* | (2006.01) |
| *H03G 3/30* | (2006.01) |
| *H04B 1/40* | (2015.01) |

(52) U.S. Cl.
CPC ............. *H03F 3/19* (2013.01); *H03G 3/3036* (2013.01); *H04B 1/40* (2013.01);
(Continued)

(58) Field of Classification Search
CPC ............ H03F 3/189; H03F 3/19; H03F 3/191;
H03F 3/195; H03F 2200/451; H03G 3/30;
H03G 3/3036; H03G 3/3042; H03G
2201/00; H03G 2201/30; H03G
2201/103; H03G 2201/307; H04B 1/40;
H04B 1/06;
(Continued)

(56) References Cited

U.S. PATENT DOCUMENTS

| 6,798,286 B2 * | 9/2004 | Dauphinee | .............. H01L 22/20 |
| | | | 348/E7.052 |
| 7,068,100 B2 * | 6/2006 | Dauphinee | ....... G01R 31/31723 |
| | | | 348/E7.052 |

(Continued)

FOREIGN PATENT DOCUMENTS

GB    2603583    8/2022

*Primary Examiner* — James M Perez
(74) *Attorney, Agent, or Firm* — Knobbe, Martens, Olson & Bear, LLP

(57) ABSTRACT

Radio frequency (RF) front ends with integrated channel matching calibration are provided herein. In one aspect, a front end system includes: a plurality of front end amplification chains including transmit and receive chains for at least two radio frequency bands, each of the front end amplification chains configured to either transmit or receive radio frequency signals via one of a plurality of antennas, and each of the front end amplification chains includes an amplifier configured to receive a bias current and amplify the corresponding radio frequency signal based on the bias current, a control circuit configured to generate each of the bias currents, and a multiplexor configured to receive the bias currents and provide the bias currents to the corresponding amplifiers.

20 Claims, 14 Drawing Sheets

(52) U.S. Cl.
CPC .................. *H03F 2200/451* (2013.01); *H03G 2201/103* (2013.01); *H03G 2201/307* (2013.01)

(58) Field of Classification Search
CPC .................. H04B 1/16; H04B 1/1607; H04B 2001/0408; H04B 2001/0416
See application file for complete search history.

(56) References Cited

U.S. PATENT DOCUMENTS

| | | | | |
|---|---|---|---|---|
| 7,183,845 | B2* | 2/2007 | Dauphinee | H04N 7/102 348/E7.052 |
| 7,260,377 | B2* | 8/2007 | Burns | G01R 31/2607 330/276 |
| 7,471,941 | B2* | 12/2008 | Dauphinee | H04N 7/102 455/341 |
| 7,501,888 | B2* | 3/2009 | Dauphinee | H03G 3/3052 330/129 |
| 7,634,244 | B2* | 12/2009 | Burns | H04B 1/109 455/340 |
| 7,791,412 | B2* | 9/2010 | Dauphinee | G01R 31/2607 330/129 |
| 7,969,241 | B2* | 6/2011 | Dauphinee | G01R 31/2607 330/129 |
| 8,094,033 | B2* | 1/2012 | Dauphinee | H03G 3/3036 324/105 |
| 8,126,094 | B2* | 2/2012 | Komaili | H04L 27/3809 375/345 |
| 8,212,593 | B2* | 7/2012 | Obkircher | H03L 7/0814 327/119 |
| 8,374,297 | B2* | 2/2013 | Komaili | H04L 27/3863 327/551 |
| 8,417,836 | B2* | 4/2013 | Obkircher | G06F 13/4291 710/3 |
| 8,437,720 | B2* | 5/2013 | Burns | H03G 3/3036 455/340 |
| 8,525,590 | B2* | 9/2013 | Joly | H03F 3/72 330/285 |
| 8,698,565 | B2* | 4/2014 | Obkircher | H03L 7/099 331/34 |
| 8,918,139 | B2* | 12/2014 | Noellert | H03F 3/24 455/313 |
| 9,077,412 | B2* | 7/2015 | Chang | G01S 7/285 |
| 9,362,870 | B2* | 6/2016 | Lam | H03F 1/0266 |
| 9,596,120 | B2* | 3/2017 | Yamanouchi | H04L 27/367 |
| 9,608,576 | B2* | 3/2017 | Lam | H03F 1/0266 |
| 9,621,119 | B2* | 4/2017 | Lehtola | H03F 3/211 |
| 9,788,187 | B2* | 10/2017 | Wang | H04W 8/005 |
| 9,813,169 | B2* | 11/2017 | Einzinger | H04W 52/08 |
| 9,893,687 | B2* | 2/2018 | Lehtola | H03F 1/0261 |
| 10,003,308 | B2* | 6/2018 | Lam | H03F 1/34 |
| 10,003,374 | B1* | 6/2018 | Lee | H03F 3/245 |
| 10,229,902 | B2* | 3/2019 | Zhu | H10D 64/257 |
| 10,270,399 | B2* | 4/2019 | Wang | H04B 1/26 |
| 10,333,470 | B2* | 6/2019 | Balteanu | H03F 1/0244 |
| 10,396,737 | B2* | 8/2019 | Domino | H03F 3/195 |
| 10,437,774 | B2* | 10/2019 | Obkircher | G06F 13/4291 |
| 10,554,188 | B2* | 2/2020 | Bergsma | H03F 3/45475 |
| 10,560,139 | B2* | 2/2020 | Brunel | H04B 1/44 |
| 10,560,202 | B2* | 2/2020 | Bergsma | H04B 1/40 |
| 10,749,562 | B2* | 8/2020 | Bai | H04B 1/44 |
| 10,812,030 | B2* | 10/2020 | Ye | H03F 3/45179 |
| 10,880,116 | B2* | 12/2020 | Zhou | H04L 12/413 |
| 10,963,418 | B2 | 3/2021 | Obkircher et al. | |
| 10,998,862 | B2* | 5/2021 | Liang | H03K 3/356182 |
| 11,075,779 | B2* | 7/2021 | Yu | H03K 19/0185 |
| 11,115,015 | B2* | 9/2021 | Zhou | H03K 5/24 |
| 11,245,552 | B2* | 2/2022 | Brunel | H04L 5/0094 |
| 11,256,281 | B2* | 2/2022 | Liang | G05F 1/595 |
| 11,309,841 | B2* | 4/2022 | Beppu | H03F 1/0205 |
| 11,327,517 | B2* | 5/2022 | Liang | G05F 1/595 |
| 11,368,179 | B2* | 6/2022 | Pehlke | H04B 1/0057 |
| 11,392,159 | B2* | 7/2022 | Liang | G05F 3/262 |
| 11,601,247 | B2* | 3/2023 | Brunel | H04L 27/2605 |
| 11,614,760 | B2* | 3/2023 | Liang | G05F 3/30 323/280 |
| 11,619,958 | B2* | 4/2023 | Liang | G05F 1/468 323/273 |
| 11,770,228 | B2* | 9/2023 | Brunel | H04L 27/26025 370/329 |
| 11,848,654 | B2* | 12/2023 | Ashworth | H04W 16/26 |
| 11,956,108 | B2* | 4/2024 | Drogi | H04B 7/0604 |
| 11,990,968 | B2* | 5/2024 | Chen | H04B 7/068 |
| 12,063,133 | B2* | 8/2024 | Drogi | H04L 5/0048 |
| 12,074,576 | B2* | 8/2024 | Lehtola | H03G 3/3042 |
| 2004/0075494 | A1* | 4/2004 | Klomsdorf | H03F 1/0261 330/129 |
| 2004/0104771 | A1* | 6/2004 | Dauphinee | H01L 22/20 348/E7.052 |
| 2004/0105033 | A1* | 6/2004 | Dauphinee | H03G 3/3036 348/707 |
| 2004/0189382 | A1* | 9/2004 | Dauphinee | G01R 31/31723 348/E7.052 |
| 2005/0130617 | A1* | 6/2005 | Burns | H01L 22/20 348/E7.052 |
| 2005/0200406 | A1* | 9/2005 | Dauphinee | H04N 7/102 348/E7.052 |
| 2005/0208910 | A1* | 9/2005 | Burns | H04N 7/102 348/678 |
| 2006/0291588 | A1* | 12/2006 | Irie | H04L 27/362 375/297 |
| 2007/0004372 | A1* | 1/2007 | Adams | H03F 1/0261 455/333 |
| 2007/0159244 | A1* | 7/2007 | Dauphinee | G01R 31/30 330/84 |
| 2009/0040059 | A1* | 2/2009 | Dauphinee | H04N 7/102 340/653 |
| 2009/0066414 | A1* | 3/2009 | Dauphinee | H04N 7/102 330/129 |
| 2010/0073572 | A1* | 3/2010 | Burns | H03G 3/3036 348/707 |
| 2010/0277235 | A1* | 11/2010 | Dauphinee | G01R 31/31723 330/254 |
| 2012/0161878 | A1* | 6/2012 | Joly | H03F 1/0277 330/296 |
| 2013/0190038 | A1* | 7/2013 | Noellert | H03F 3/195 455/571 |
| 2014/0027638 | A1* | 1/2014 | Chang | G01S 7/285 250/338.1 |
| 2016/0248379 | A1* | 8/2016 | Lehtola | H03F 3/195 |
| 2016/0322947 | A1* | 11/2016 | Ishihara | H03F 1/34 |
| 2017/0149512 | A1* | 5/2017 | Einzinger | H04W 52/08 |
| 2017/0194919 | A1* | 7/2017 | Lehtola | H03F 3/195 |
| 2017/0214372 | A1* | 7/2017 | Muralidharan | H03F 3/72 |
| 2017/0237403 | A1* | 8/2017 | Wang | H03F 1/56 330/288 |
| 2018/0138877 | A1* | 5/2018 | Bergsma | H03G 3/20 |
| 2020/0059202 | A1* | 2/2020 | Jo | H03F 1/305 |
| 2020/0266767 | A1* | 8/2020 | Wu | H03F 3/72 |
| 2020/0272182 | A1* | 8/2020 | Liang | G05F 1/468 |
| 2020/0272183 | A1* | 8/2020 | Liang | G05F 1/575 |
| 2020/0295709 | A1* | 9/2020 | Beppu | H03F 3/19 |
| 2021/0132642 | A1* | 5/2021 | Liang | H03K 19/0016 |
| 2021/0210415 | A1* | 7/2021 | Liu | H03F 3/195 |
| 2021/0211107 | A1* | 7/2021 | Liu | H03F 3/245 |
| 2021/0218433 | A1* | 7/2021 | Liang | H03F 3/68 |
| 2022/0060202 | A1* | 2/2022 | Nisbet | H03F 3/45197 |
| 2022/0254812 | A1* | 8/2022 | Wang | H03F 3/213 |
| 2022/0271720 | A1* | 8/2022 | Shimamoto | H03F 1/0261 |
| 2022/0352888 | A1* | 11/2022 | Blin | H03K 17/6874 |
| 2022/0385249 | A1* | 12/2022 | Brunel | H03F 3/211 |
| 2022/0385314 | A1* | 12/2022 | Kogure | H03F 3/245 |
| 2022/0413533 | A1* | 12/2022 | Liang | G05F 1/575 |
| 2023/0012894 | A1* | 1/2023 | Liang | H03F 1/223 |
| 2023/0014555 | A1* | 1/2023 | Liang | H03F 3/245 |
| 2023/0038733 | A1* | 2/2023 | Blin | H03F 3/245 |
| 2023/0100609 | A1* | 3/2023 | Liang | G06F 1/26 713/320 |
| 2023/0114964 | A1* | 4/2023 | Blin | H03F 3/245 327/526 |

(56) References Cited

U.S. PATENT DOCUMENTS

| | | | |
|---|---|---|---|
| 2023/0208044 A1* | 6/2023 | Brunel | H01Q 5/42 |
| | | | 370/297 |
| 2023/0216449 A1* | 7/2023 | Liang | H03F 3/19 |
| | | | 330/296 |
| 2023/0216527 A1* | 7/2023 | Raghavan | H04B 1/0057 |
| | | | 370/297 |
| 2023/0246547 A1* | 8/2023 | Zhou | H03F 3/191 |
| | | | 327/536 |
| 2023/0253991 A1* | 8/2023 | Blin | H04B 1/1607 |
| | | | 455/552.1 |
| 2024/0056040 A1* | 2/2024 | Sakurai | H03F 1/0277 |
| 2024/0128936 A1* | 4/2024 | Tahara | H03F 3/19 |
| 2024/0429871 A1* | 12/2024 | Tahara | H03F 1/565 |
| 2024/0429879 A1* | 12/2024 | De Falco | H03F 1/0266 |

* cited by examiner

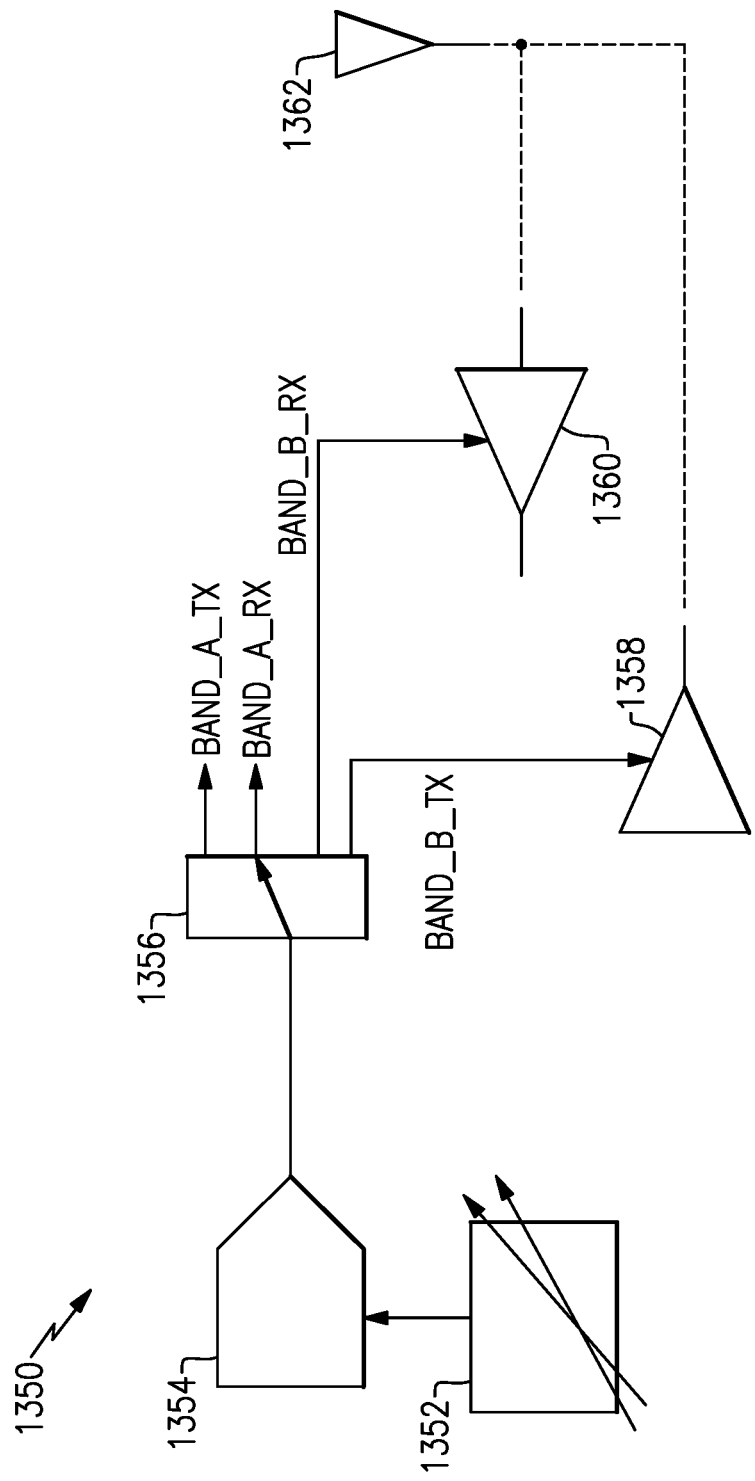

RADIO FREQUENCY FRONT END WITH INTEGRATED CHANNEL MATCHING CALIBRATION

CROSS-REFERENCE TO RELATED APPLICATION(S)

Any and all applications for which a foreign or domestic priority claim is identified in the Application Data Sheet as filed with the present application are hereby incorporated by reference under 37 CFR 1.57.

BACKGROUND

Field

Aspects of this disclosure relate to radio frequency (RF) communication systems, and in particular, multi-channel RF communication systems.

Description of the Related Technology

RF communication systems typically include an RF front end which couples transmit and receive paths between a baseband processor and one or more antennas. Such RF communication systems can be used in a variety of different wireless communication modes, including beamforming in which the gain and/or phase of parallel front end communication chains are adjusted to focus a transmit or receive beam at a desired beam angle. The amplifiers used in the front end communication chains may be adjusted for beamforming or other purposes (e.g., such as temperature variations) to improve RF communication.

SUMMARY

The systems, methods and devices of this disclosure each have several innovative aspects, no single one of which is solely responsible for the desirable attributes disclosed herein.

In one aspect, there is provided a front end system comprising: a plurality of front end amplification chains including transmit and receive chains for at least two radio frequency bands, each of the front end amplification chains configured to either transmit or receive radio frequency signals via one of a plurality of antennas, and each of the front end amplification chains further including an amplifier configured to receive a bias current and amplify the corresponding radio frequency signal; a control circuit configured to generate each of the bias currents; and a multiplexor configured to receive the bias currents and provide the bias currents to the corresponding amplifiers.

In some embodiments, the antennas, the front end amplification chains, the control circuit, and the multiplexor are all formed on a single die.

In some embodiments, each of the front end amplification chains is configured to transmit or receive the radio frequency signals in a millimeter wave spectrum or a TeraHertz spectrum.

In some embodiments, each of the front end amplification chains is configured to transmit or receive the radio frequency signals in a 5G spectrum.

In some embodiments, the control circuit includes a current digital-to-analog converter configured to receive a digital reference current value and generate the bias current based on the digital reference current value.

In some embodiments, the control circuit includes a shared bias generator circuit configured to receive a trim bias current value and a temperature coefficient and generate the digital reference current value based on the trim bias current value and the temperature coefficient.

In some embodiments, the control circuit includes a shared bias generator circuit configured to receive a trim bias current value and generate the digital reference current value based on the trim bias current value.

In some embodiments, each of the front end amplification chains comprises a plurality of amplification stages, wherein each of the bias currents corresponding to one of the plurality amplification stages, and wherein the multiplexor comprises a plurality of multiplexors, each of the plurality of multiplexors configured to receive the bias currents for a corresponding one of the amplification stages and provide the bias currents to the corresponding amplification stages of each of the front end amplification chains.

In some embodiments, the control circuit is further configured to generate the bias current based on a temperature coefficient and a trim bias current.

In some embodiments, each of the front end amplification chains includes an attenuator or a programmable gain stage configured to adjust the gain of the corresponding front end amplification chain.

In another aspect, there is provided a radio frequency device comprising: a plurality of antennas; and a front end system including a plurality of front end amplification chains including transmit and receive chains for at least two radio frequency bands, each of the front end amplification chains configured to either transmit or receive radio frequency signals via one of the plurality of antennas, and each of the front end amplification chains includes an amplifier configured to receive a bias current and amplify the corresponding radio frequency signal, a control circuit configured to generate each of the bias currents, and a multiplexor configured to receive the bias currents and provide the bias currents to the corresponding amplifiers.

In some embodiments, the antennas, the front end amplification chains, the control circuit, and the multiplexor are all formed on a single die.

In some embodiments, each of the front end amplification chains is configured to transmit or receive the radio frequency signals in a millimeter wave spectrum.

In some embodiments, each of the front end amplification chains is configured to transmit or receive the radio frequency signals in a 5G spectrum.

In some embodiments, the control circuit includes a current digital-to-analog converter configured to receive a digital reference current value and generate the bias current based on the digital reference current value.

In some embodiments, the control circuit includes a shared bias generator circuit configured to receive a trim bias current value and a temperature coefficient and generate the digital reference current value based on the trim bias current value and the temperature coefficient.

In some embodiments, each of the front end amplification chains comprises a plurality of amplification stages, wherein each of the bias currents corresponding to one of the plurality amplification stages, and wherein the multiplexor comprises a plurality of multiplexors, each of the plurality of multiplexors configured to receive the bias currents for a corresponding one of the amplification stages and provide the bias currents to the corresponding amplification stages of each of the front end amplification chains.

In some embodiments, the control circuit is further configured to generate the bias current based on a temperature coefficient and a trim bias current.

In some embodiments, the radio frequency device comprises one of the following: a telecommunications device, a telecommunications satellite, a base station, a mobile device, and a radar device.

In yet another aspect, there is provided a method comprising: generating, at a control circuit, a bias current; receiving the bias current at a multiplexor, the multiplexor and control circuit formed on a front end system including a plurality of front end amplification chains including transmit and receive chains for at least two radio frequency bands, each of the front end amplification chains configured to either transmit or receive radio frequency signals via one of a plurality of antennas, and each of the front end amplification chains includes an amplifier configured to receive the bias current and amplify the corresponding radio frequency signal; and providing, by the multiplexor, the bias current to the amplifier of a selected one of the plurality of front end amplification chains.

In some embodiments, the antennas, the front end amplification chains, the control circuit, and the multiplexor are all formed on a single die.

In some embodiments, the control circuit includes a current digital-to-analog converter configured to receive a digital reference current value and generate the bias current based on the digital reference current value.

In some embodiments, the method comprises: receiving, at a shared bias generator circuit of the control circuit, a trim bias current value and a temperature coefficient; and generating, at the shared bias generator circuit, the digital reference current value based on the trim bias current value and the temperature coefficient.

BRIEF DESCRIPTION OF THE DRAWINGS

FIGS. 10A and 10B are schematic diagrams illustrating RF front ends in accordance with aspects of this disclosure.

DETAILED DESCRIPTION

Figure 1:
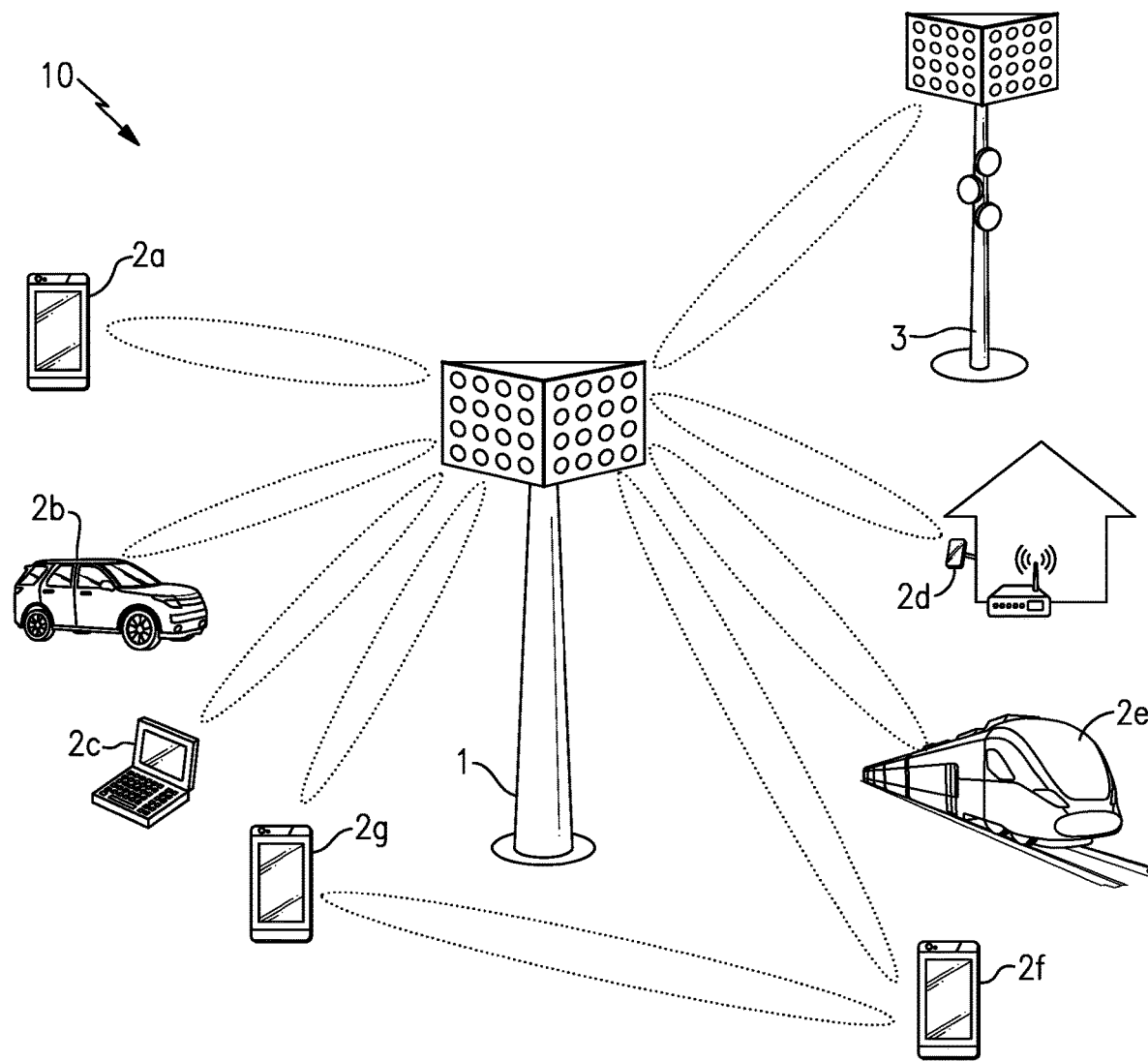
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Example 5G Communication Network

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2020). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Example Beamforming Systems

Figure 2A:
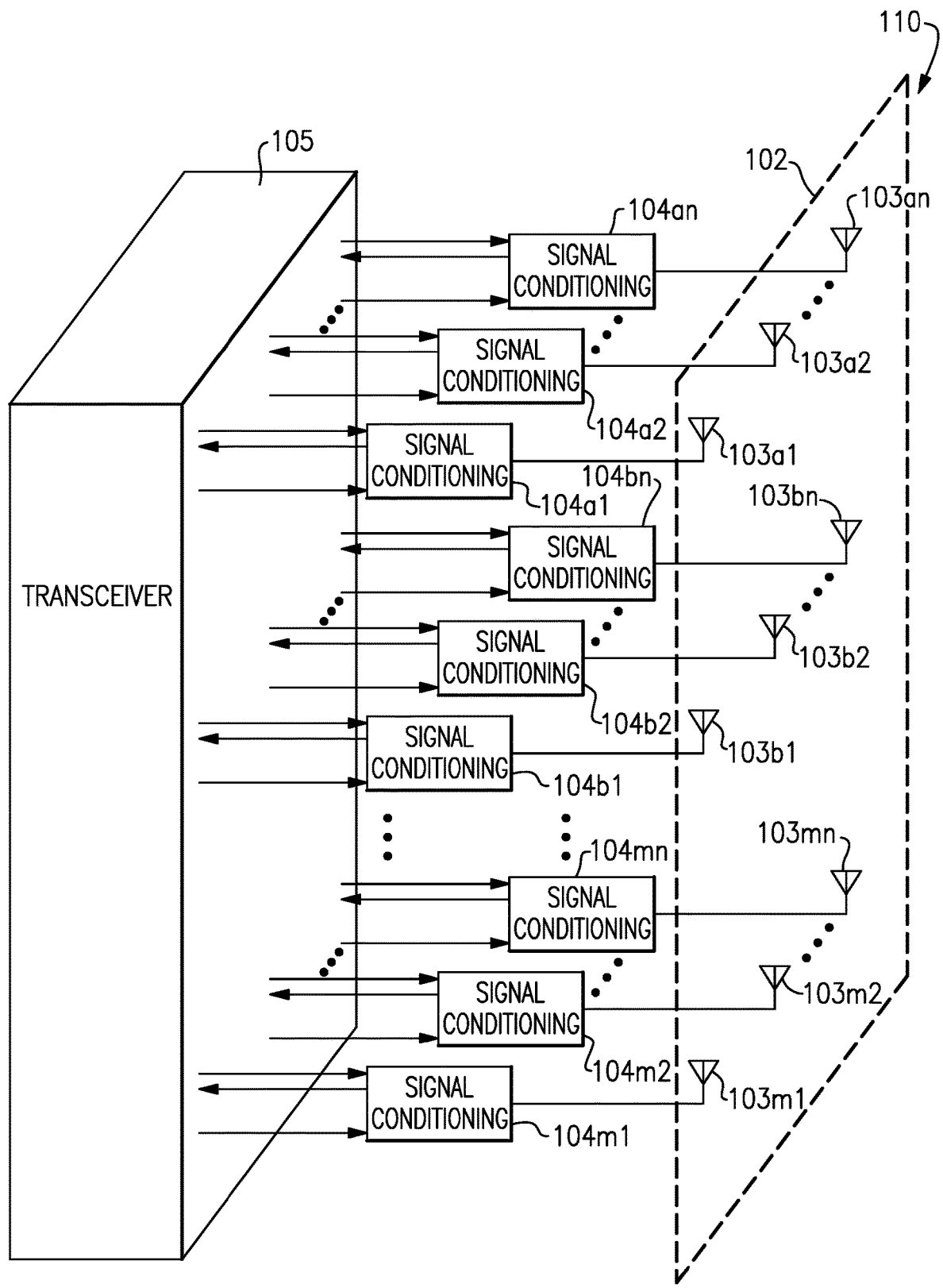
FIG. 2A is a schematic diagram of one example of a communication system that operates with beamforming.

FIG. 2A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 2A, the transceiver 105 generates control signals for the signal conditioning circuits. The control signals can be used for a variety of functions, such as controlling the gain and phase of transmitted and/or received signals to control beamforming.

Figure 2B:
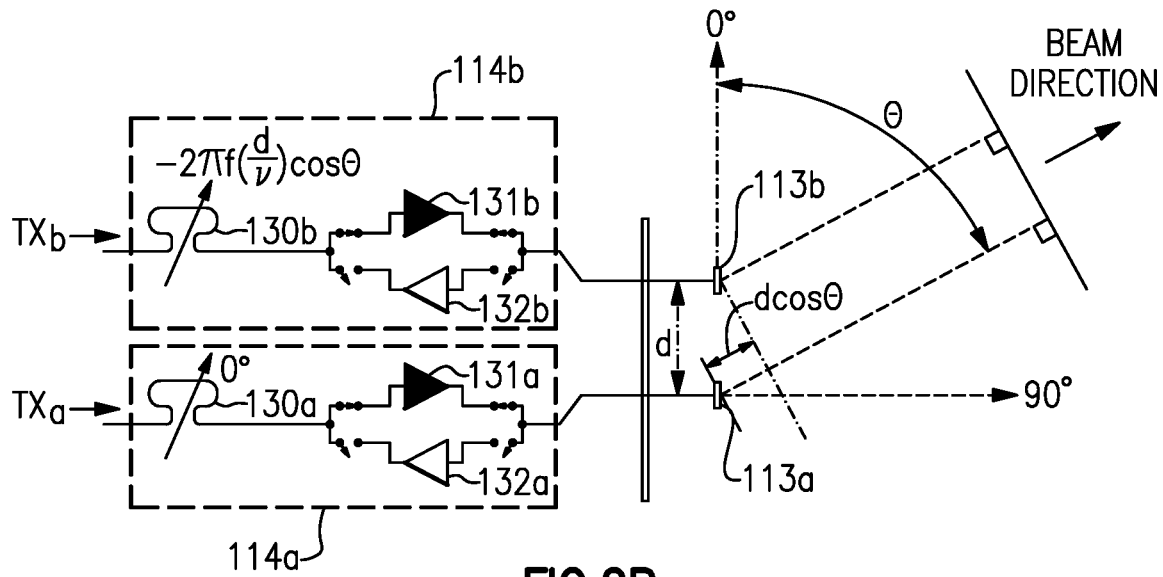
FIG. 2B is a schematic diagram of one example of beamforming to provide a transmit beam.

FIG. 2B is a schematic diagram of one example of beamforming to provide a transmit beam. FIG. 2B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 2B illustrates one embodiment of a portion of the communication system 110 of FIG. 2A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 2B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about $\frac{1}{2}\lambda$, where λ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a baseband processor and/or a transceiver (for example, the transceiver 105 of FIG. 2A) controls phase values of one or more phase shifters and gain values of one or more controllable amplifiers to control beamforming.

Figure 2C:
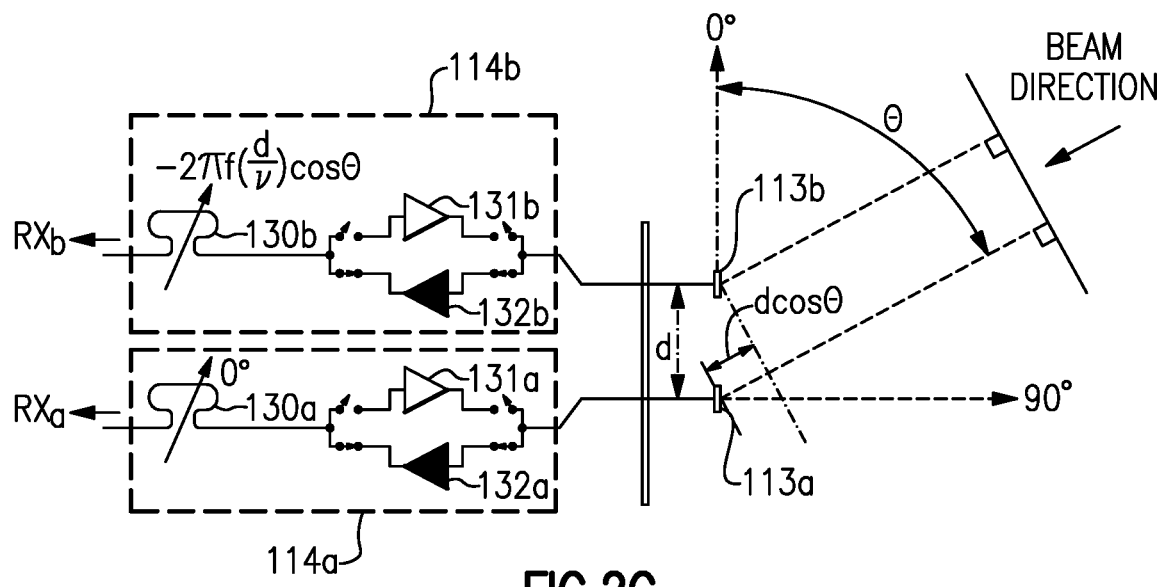
FIG. 2C is a schematic diagram of one example of beamforming to provide a receive beam.

FIG. 2C is a schematic diagram of one example of beamforming to provide a receive beam. FIG. 2C is similar to FIG. 2B, except that FIG. 2C illustrates beamforming in the context of a receive beam rather than a transmit beam.

As shown in FIG. 2C, a relative phase difference between the first phase shifter 130a and the second phase shifter 130b can be selected to about equal to $-2\pi f(d/v)\cos\theta$ radians to achieve a desired receive beam angle θ. In implementations in which the distance d corresponds to about $\frac{1}{2}\lambda$, the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Figure 3A:
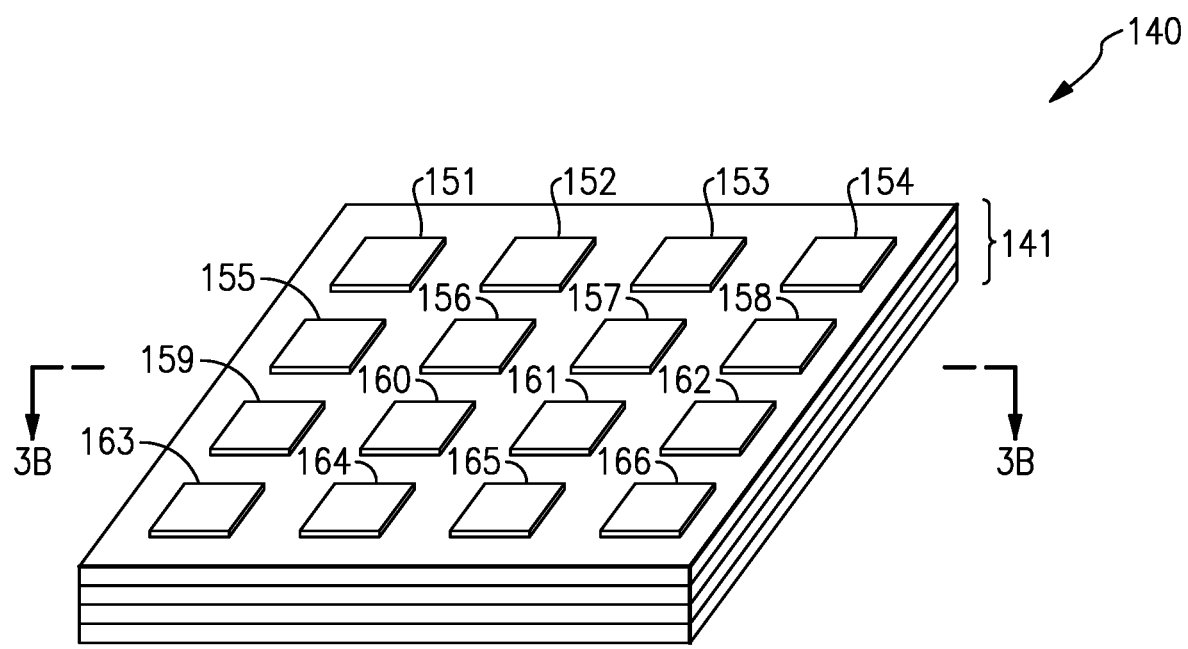
FIG. 3A is a perspective view of one embodiment of a module that operates with beamforming.
Figure 3B:
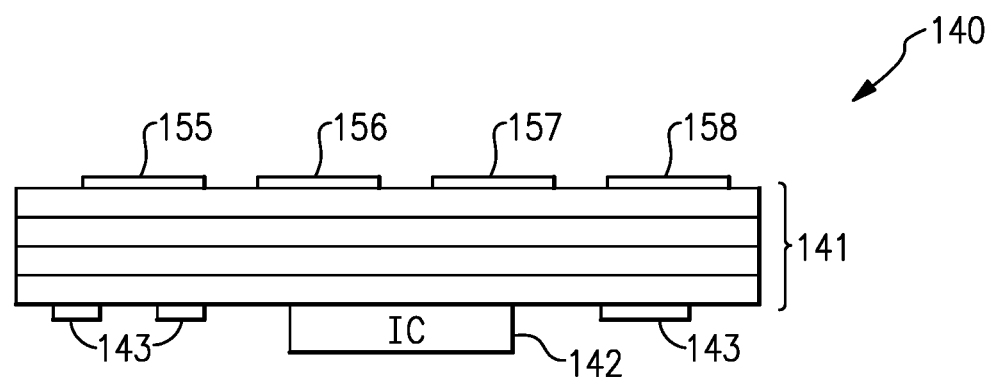
FIG. 3B is a cross-section of the module of FIG. 3A taken along the lines 3B-3B.

FIG. 3A is a perspective view of one embodiment of a module 140 that operates with beamforming. FIG. 3B is a cross-section of the module 140 of FIG. 3A taken along the lines 3B-3B.

The module 140 includes a laminated substrate or laminate 141, a semiconductor die or IC 142, surface mount components 143, and an antenna array including patch antenna elements 151-166.

Although one embodiment of a module is shown in FIGS. 3A and 3B, the teachings herein are applicable to modules implemented in a wide variety of ways. For example, a module can include a different arrangement of and/or number of antenna elements, dies, and/or surface mount components. Additionally, the module 140 can include additional structures and components including, but not limited to, encapsulation structures, shielding structures, and/or wirebonds.

In the illustrated embodiment, the antenna elements 151-166 are formed on a first surface of the laminate 141, and can be used to transmit and/or receive signals. Although the illustrated antenna elements 151-166 are rectangular, the antenna elements 151-166 can be shaped in other ways. Additionally, although a 4×4 array of antenna elements is shown, more or fewer antenna elements can be provided. Moreover, antenna elements can be arrayed in other patterns or configurations. Furthermore, in another embodiment, multiple antenna arrays are provided, such as separate antenna arrays for transmit and receive and/or multiple antenna arrays for MIMO and/or switched diversity.

In certain implementations, the antenna elements 151-166 are implemented as patch antennas. A patch antenna can include a planar antenna element positioned over a ground plane. A patch antenna can have a relatively thin profile and exhibit robust mechanical strength. In certain configurations, the antenna elements 151-166 are implemented as patch antennas with planar antenna elements formed on the first surface of the laminate 141 and the ground plane formed using an internal conductive layer of the laminate 141.

Although an example with patch antennas is shown, a modulate can include any suitable antenna elements, including, but not limited to, patch antennas, dipole antennas, ceramic resonators, stamped metal antennas, and/or laser direct structuring antennas.

In the illustrated embodiment, the IC 142 and the surface mount components 143 are on a second surface of the laminate 141 opposite the first surface.

In certain implementations, the IC 142 includes signal conditioning circuits associated with the antenna elements 151-166. In one embodiment, the IC 142 includes a serial interface, such as a mobile industry processor interface radio frequency front-end (MIPI RFFE) bus and/or inter-integrated circuit (I²C) bus that receives data for controlling the signal conditioning circuits, such as the amount of phase shifting provided by phase shifters. In another embodiment, the IC 142 includes signal conditioning circuits associated with the antenna elements 151-166 and an integrated transceiver.

The laminate 141 can be implemented in a variety of ways, and can include for example, conductive layers, dielectric layers, solder masks, and/or other structures. The number of layers, layer thicknesses, and materials used to form the layers can be selected based on a wide variety of factors, which can vary with application. The laminate 141 can include vias for providing electrical connections to signal feeds and/or ground feeds of the antenna elements 151-166. For example, in certain implementations, vias can aid in providing electrical connections between signaling conditioning circuits of the IC 142 and corresponding antenna elements.

The module 140 can be included in a communication system, such as a mobile phone or base station. In one example, the module 140 is attached to a phone board of a mobile phone.

Example Mobile Device

Figure 4:
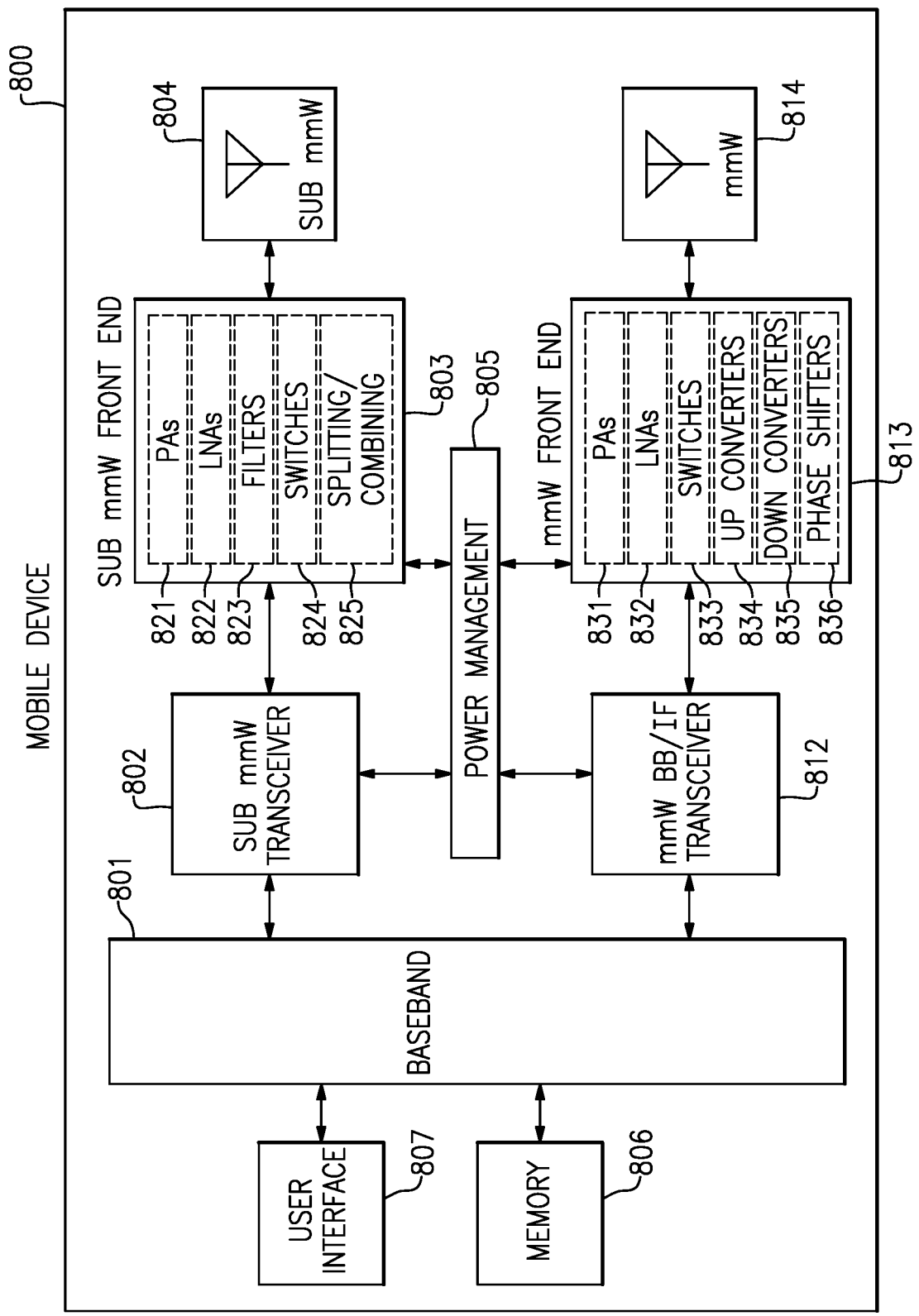
FIG. 4 is a schematic diagram of one embodiment of a mobile device.

FIG. 4 is a schematic diagram of one embodiment of a mobile device 800. The mobile device 800 includes a baseband system 801, a sub millimeter wave (mmW) transceiver 802, a sub mmW front end system 803, sub mmW antennas 804, a power management system 805, a memory 806, a user interface 807, a mmW baseband (BB)/intermediate frequency (IF) transceiver 812, a mmW front end system 813, and mmW antennas 814.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

In the illustrated embodiment, the sub mmW transceiver 802, sub mmW front end system 803, and sub mmW antennas 804 serve to transmit and receive centimeter waves and other radio frequency signals below millimeter wave frequencies. Additionally, the mmW BB/IF transceiver 812, mmW front end system 813, and mmW antennas 814 serve to transmit and receive millimeter waves. Although one specific example is shown, other implementations are possible, including, but not limited to, mobile devices operating using circuitry operating over different frequency ranges and wavelengths.

The sub mmW transceiver 802 generates RF signals for transmission and processes incoming RF signals received from the sub mmW antennas 804. It will be understood that various functionalities associated with the transmission and receiving of RF signals can be achieved by one or more components that are collectively represented in FIG. 4 as the sub mmW transceiver 802. In one example, separate components (for instance, separate circuits or dies) can be provided for handling certain types of RF signals.

The sub mmW front end system 803 aids is conditioning signals transmitted to and/or received from the antennas 804. In the illustrated embodiment, the front end system 803 includes power amplifiers (PAs) 821, low noise amplifiers (LNAs) 822, filters 823, switches 824, and signal splitting/combining circuitry 825. However, other implementations are possible.

For example, the sub mmW front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The sub mmW antennas 804 can include antennas used for a wide variety of types of communications. For example, the sub mmW antennas 804 can include antennas for transmitting and/or receiving signals associated with a wide variety of frequencies and communications standards.

The mmW BB/IF transceiver 812 generates millimeter wave signals for transmission and processes incoming millimeter wave signals received from the mmW antennas 814. It will be understood that various functionalities associated with the transmission and receiving of RF signals can be achieved by one or more components that are collectively represented in FIG. 4 as the mmW transceiver 812. The mmW BB/IF transceiver 812 can operate at baseband or intermediate frequency, based on implementation.

The mmW front end system 813 aids is conditioning signals transmitted to and/or received from the mmW antennas 814. In the illustrated embodiment, the front end system 803 includes power amplifiers 831, low noise amplifiers 832, switches 833, up converters 834, down converters 835, and phase shifters 836. However, other implementations are possible. In one example, the mobile device 800 operates with a BB mmW transceiver, and up converters and downconverters are omitted from the mmW front end system. In another example, the mmW front end system further includes filters for filtering millimeter wave signals.

The mmW antennas 814 can include antennas used for a wide variety of types of communications. The mmW antennas 814 can include antenna elements implemented in a wide variety of ways, and in certain configurations the antenna elements are arranged to form one or more antenna arrays. Examples of antenna elements for millimeter wave antenna arrays include, but are not limited to, patch antennas, dipole antenna elements, ceramic resonators, stamped metal antennas, and/or laser direct structuring antennas.

In certain implementations, the mobile device 800 supports MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

In certain implementations, the mobile device 800 operates with beamforming. For example, the mmW front end system 803 includes amplifiers having controllable gain and phase shifters having controllable phase to provide beam formation and directivity for transmission and/or reception of signals using the mmW antennas 814. For example, in the context of signal transmission, the amplitude and phases of the transmit signals provided to an antenna array used for transmission are controlled such that radiated signals combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antenna array from a particular direction.

The baseband system 801 is coupled to the user interface 807 to facilitate processing of various user input and output (I/O), such as voice and data. The baseband system 801 provides the sub mmW and mmW transceivers with digital representations of transmit signals, which are processed by the transceivers to generate RF signals for transmission. The baseband system 801 also processes digital representations of received signals provided by the transceivers. As shown in FIG. 4, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers of the front end systems. For example, the power management system 805 can be configured to change the supply voltage(s) provided to one or more of the power amplifiers to improve efficiency, such as power added efficiency (PAE).

In certain implementations, the power management system 805 receives a battery voltage from a battery. The battery can be any suitable battery for use in the mobile device 800, including, for example, a lithium-ion battery.

Example Power Amplifier Systems

Figure 5A:
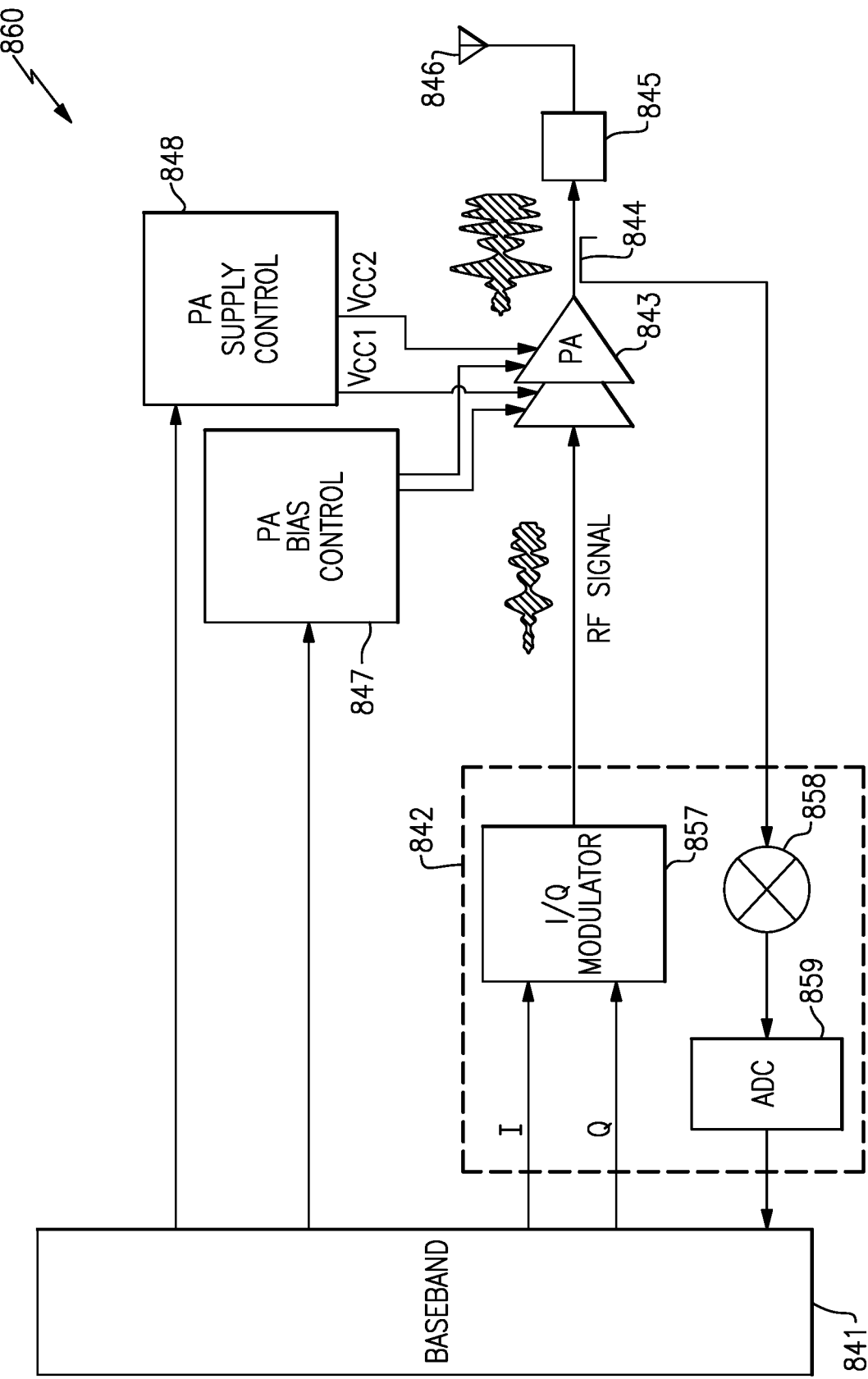
FIG. 5A is a schematic diagram of a power amplifier system according to one embodiment.

FIG. 5A is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 5A, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 5B:
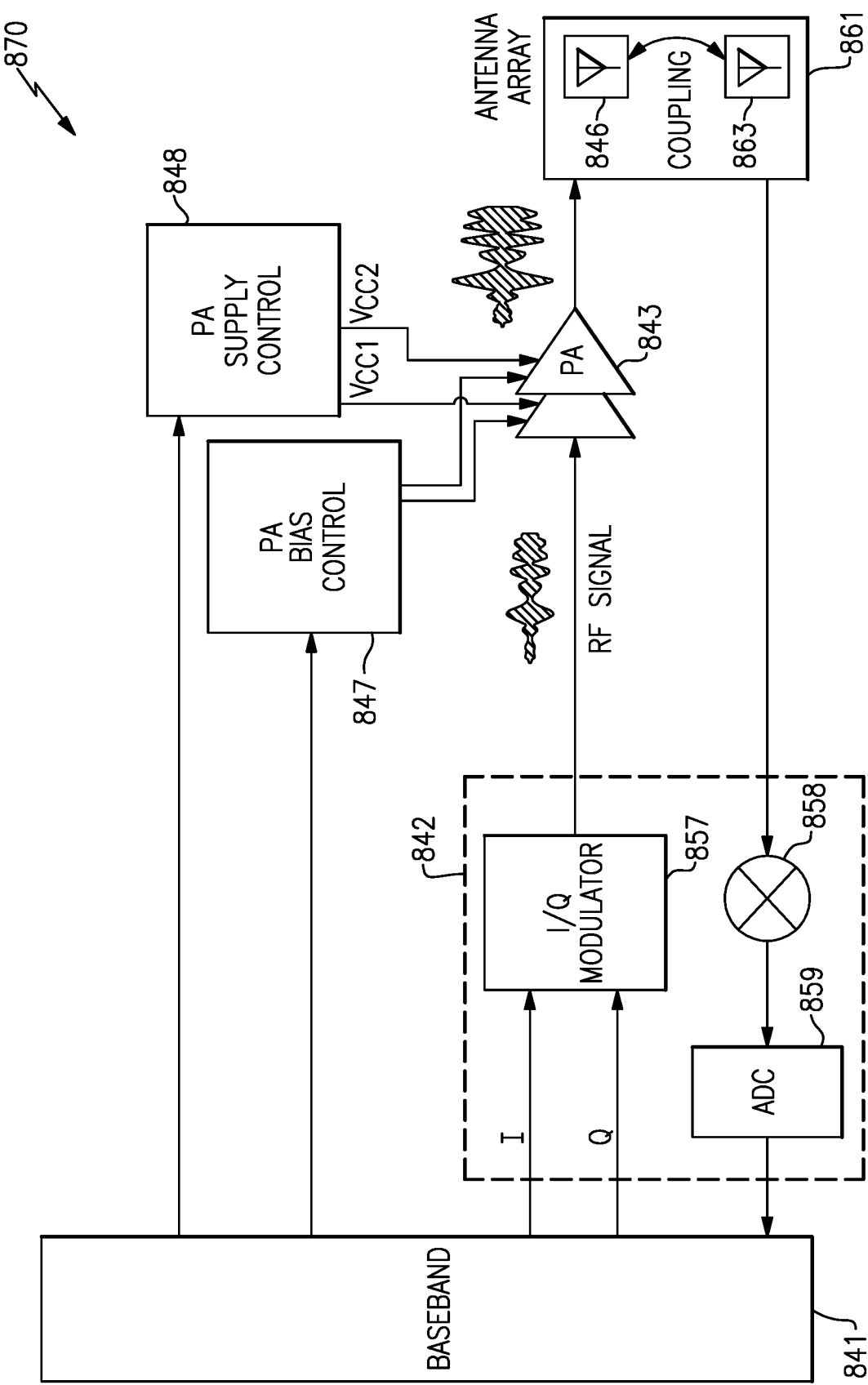
FIG. 5B is a schematic diagram of a power amplifier system according to another embodiment.

FIG. 5B is a schematic diagram of a power amplifier system 870 according to another embodiment. The illustrated power amplifier system 870 includes a baseband processor 841, a transmitter/observation receiver 842, a power amplifier 843, an antenna array 861, a PA bias control circuit 847, and a PA supply control circuit 848. As shown in FIG. 5B, the antenna array 861 includes an antenna 861 and an observation antenna 863.

The power amplifier system 870 of FIG. 5B is similar to the power amplifier system 860 of FIG. 5A, except that the power amplifier system 870 omits the directional coupler 844 and the front-end circuitry 845 of FIG. 5A to avoid loading loss at the output of the power amplifier 843. For example, the power amplifier system 870 can aid in providing low signal loss when transmitting at millimeter wave frequencies. As shown in FIG. 5B, the observation antenna 863 is coupled to the antenna 861 by antenna-to-antenna coupling, and serves to provide an observation signal for the observation path of the transmitter/observation receiver 842.

Front End Architecture with Integrated Channel Matching

Aspects of this disclosure relate to systems and methods for biasing the amplifiers used in a front end system, in particular for mmW beamforming systems. For example, fine level trimming of amplifiers in the RF front end can be used for third order intercept point (IP3), gain, and/or expansion calibration of both transmit and receive chains for multi-channel devices in order to reach desired levels of matching between RF or mmW channels. In particular, aspects of this disclosure can achieve the comparable or improved levels of calibration/trimming compared to other implementations with a smaller layout area or footprint.

This reduced area can be particularly advantageous for RF systems capable of beamforming at millimeter wave frequencies (e.g., 30 GHz to 300 GHz). For example, the antennas used for millimeter wave frequencies may be patch antennas having a defined size with the front end system formed in the same area occupied by the corresponding antennas (e.g., on opposing sides of a chip). Due to the limited size occupied by the antennas, reducing the size of the RF front end can be helpful in ensuring that the RF front end fits within the allowable area. However, aspects of this disclosure are not limited to RF systems used for beamforming and/or at millimeter wave frequencies and can be used in other RF systems including, for example, 5G RF systems and in the TeraHertz spectrum.

Figure 6:
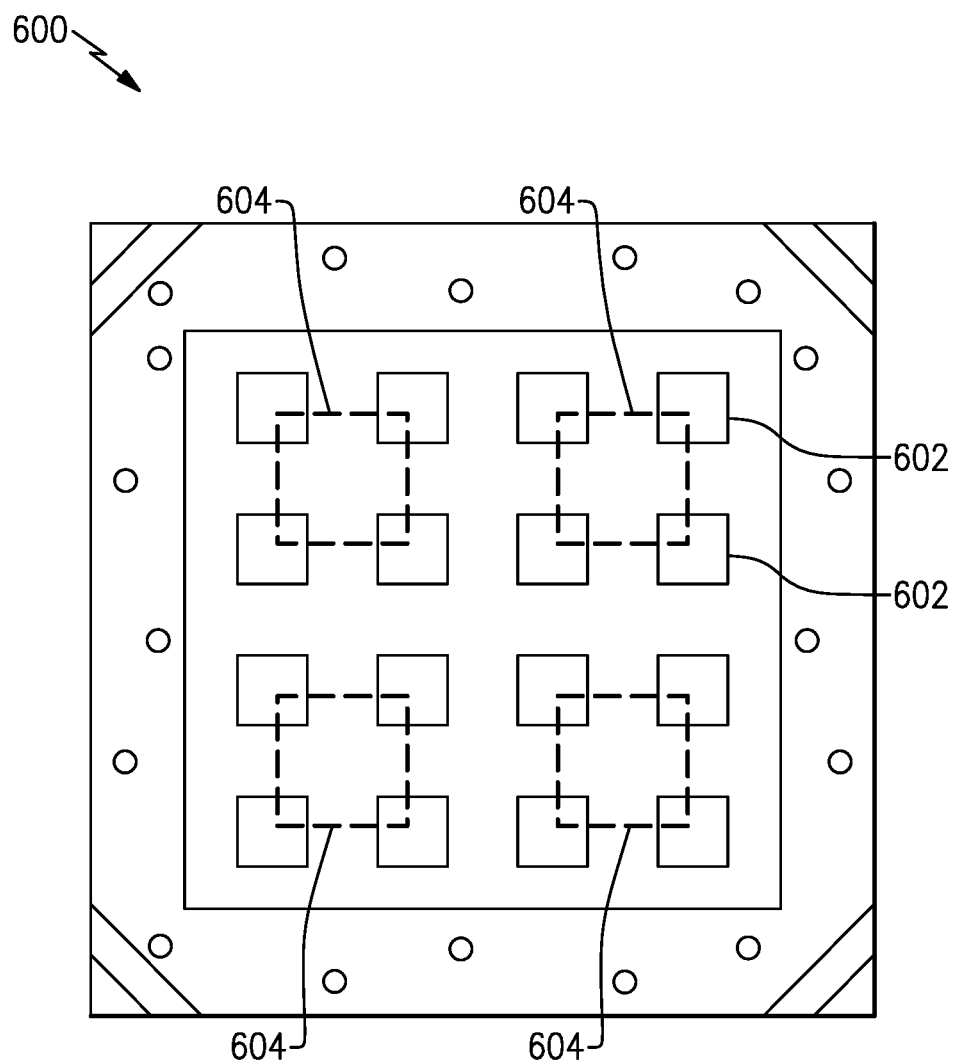
FIG. 6 is a diagram of an RF system including a plurality of antennas and a plurality of RF front ends in accordance with aspects of this disclosure.

Beamforming at millimeter wave frequencies typically employ a plurality of patch antennas, each of which is driven by a millimeter wave front-end configured to provide accurate phase and amplitude to each of the antennas with respect to each other. FIG. 6 is a diagram of an RF system 600 including a plurality of antennas 602 and a plurality of RF front ends 604 in accordance with aspects of this disclosure.

As shown in FIG. 6, four channels can be collocated on a single chip/module 600 (also referred to as a front end integrated circuit (FEIC). However, in other embodiments, more of fewer channels can be collocated on a single chip/module. Process variations and other die(s), component(s), PCB(s), and/or module mismatch(es) may result in different gain(s) between the channels included on the chip 600. In order to facilitate calibration, each channel on the transmit and/or receive side is matched (e.g., for both phase and gain) to the other channels. Embodiments of the RF front end architectures described herein enable accurate gain matching between the various channels of the FEIC 600, while reducing the area occupied by the RF front end. Alternatively an offset in gain or phase can be desirable to achieve the system level targets in which the FEIC is used. For instance, a phase and gain offset can be used to compensate for different trace length between the FEIC and the antenna patches.

Depending on the embodiment, an RF system may include a relatively large number of channels, each of which are coupled to an RF front end including control circuitry occupying a certain area of the FEIC 600. As is described herein, aspects of this disclosure provide multiplex biasing blocks and signals between operation modes (e.g., receive and transmit) as well as two or more frequency bands to reduce the die area occupied by the control circuitry.

Additionally, aspects of this disclosure also provide control of a temperature coefficient (e.g., which is used to bias amplifiers in the RF front end) while maintaining the room temp calibration. Advantageously, this process can simplify lab work used to calibrate the RF system and reduce automatic test equipment (ATE) test time.

With reference to FIG. 6, the spacing between the patch antennas 602 may be determined by the wavelength of the RF signal (e.g., for a millimeter wave about 4-5 mm) which limits to the size of the FEIC. Thus, area reduction for the FEIC is desirable such that the FEIC can fit within the space dictated by the antenna 602 spacing. Aspects of this disclosure relate to techniques for reducing the space occupied by the biasing circuitry of a multi channel, multi-band, receive/transmit, multi-staged FEIC.

Figure 7:
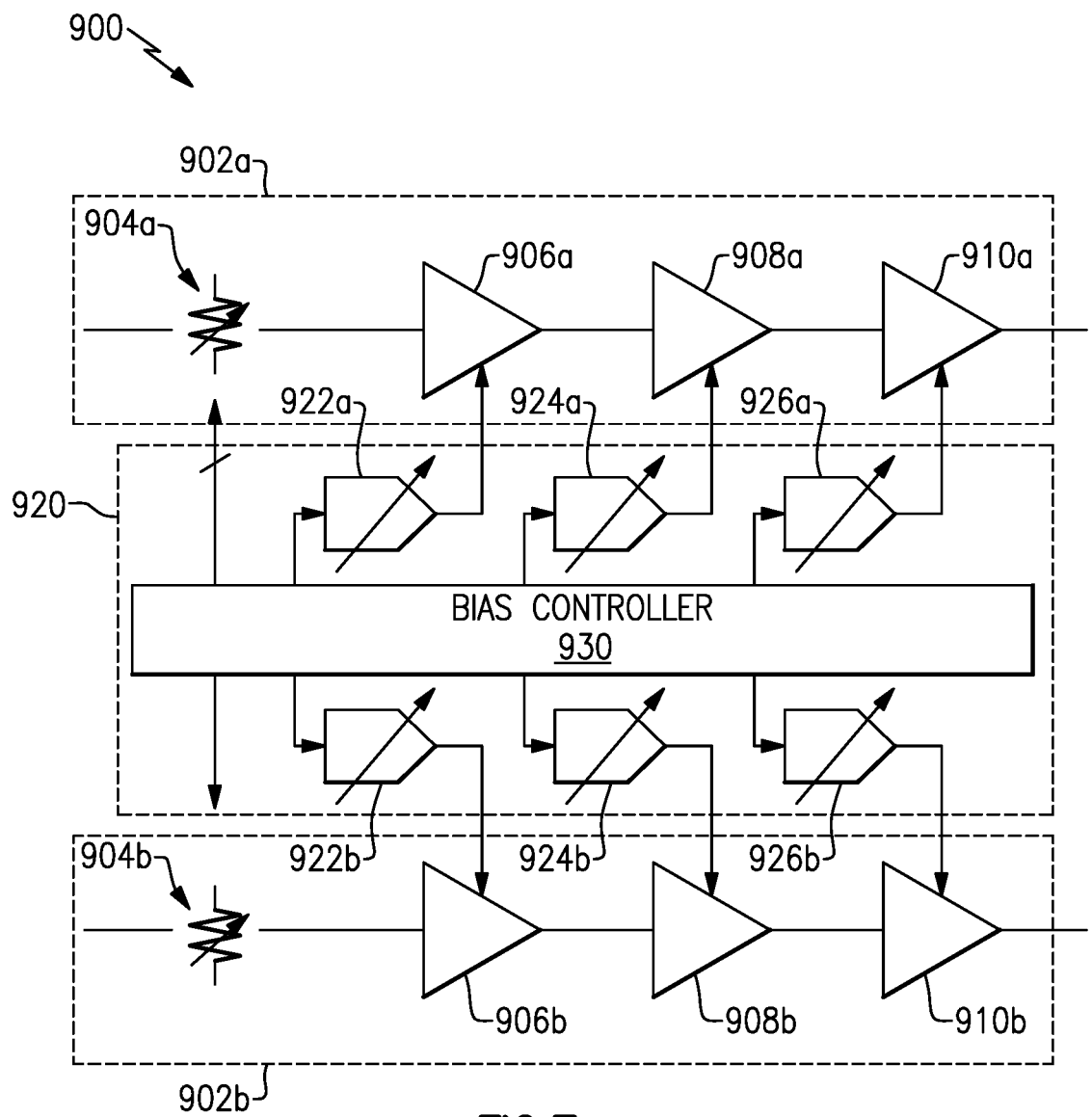
FIG. 7 is a schematic diagram of an RF front end system including a plurality of amplification chains in accordance with aspects of this disclosure.

FIG. 7 is a schematic diagram of an RF front end system 900 including a plurality of amplification chains 902a and 902b in accordance with aspects of this disclosure. The RF front end system 900 includes two transmit front end amplification chains 902a and 902b (also referred to simply as chains), and a control circuit 920. The transmit chains 902a and 902b may operate at different frequency bands. The first transmit chain 902a includes a programmable attenuator 904a and a plurality of power amplifiers 906a-910a. Each of the power amplifiers 906a-910a provides a stage of amplification. Similarly, the second transmit chain 902b includes a programmable attenuator 904b and a plurality of power amplifiers 906b-910b. Although FIG. 7 illustrates an example including two transmit front end amplification chains 902a, those skilled in the art would recognize that the RF front end system 900 can also be applied to one or more receive chains as well as receive/transmit chains.

The control circuit 920 includes a bias controller 930 and a plurality of current digital-to-analog converts (DACs) 922a-926b, each of which is coupled to the bias controller 930 and a corresponding stage or bias circuitry of the power amplifiers 906a-910b. The bias controller 930 is configured to control each of the programmable attenuators 904a and 904b to adjust the attenuation applied to the RF signals received at the programmable attenuators 904a and 904b. Depending on the implementation, bias controller 930 can control the programmable attenuators 904a and 904b using coarse and/or fine gain steps.

The bias controller 930 is further configured to provide individual bias currents to each amplification stage 906b-910b of the chains 902a and 902b via the corresponding current DACs 922a-926b. Accordingly, the control circuit 920 is configured to control the gain of each chain 902a and 902b as well as matching between channels (e.g., the gain difference between channels).

The gain can also be controlled by altering the structure of the amplification stage (switchable periphery, switchable load etc.). For example, in various embodiments the attenuator can be replaced or complemented by a programmable gain stage. Thus, the control of the gain for each chain is not limited to the particular implementation illustrated in FIG. 7.

Figure 8:
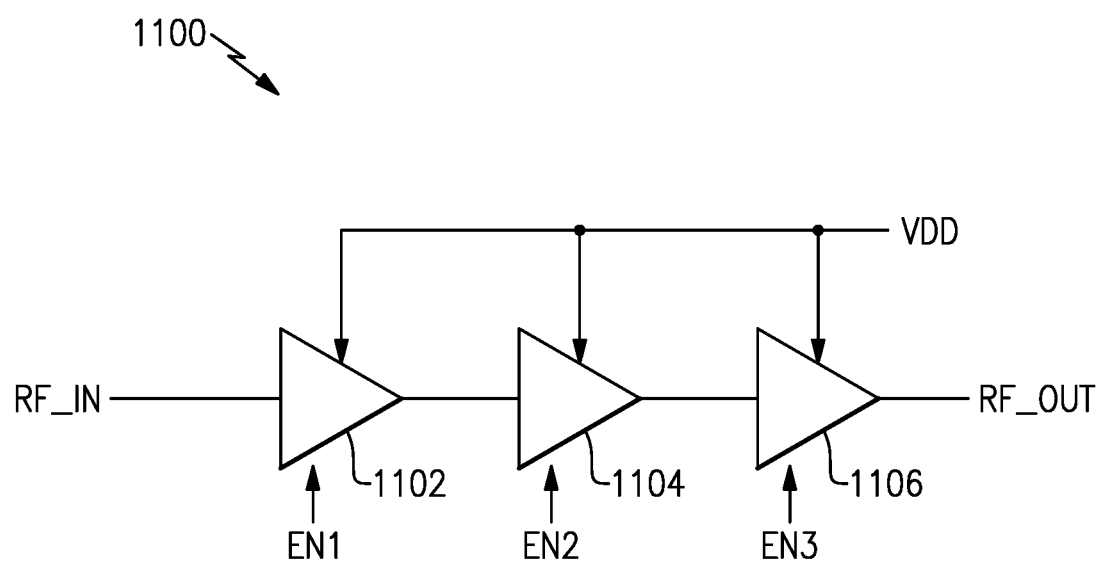
FIG. 8 is a schematic diagram of a front end amplification chain in accordance with aspects of this disclosure.

FIG. 8 is a schematic diagram of a front end amplification chain 1100 in accordance with aspects of this disclosure. The front end amplification chain 1100 includes a plurality of amplifiers 1102-1106, each of which provides a stage of amplification. When the chain 1100 is embodied as a transmit chain 1100, the amplifiers 1102-1106 may be embodied as power amplifiers 1102-1106. When the chain 1100 is embodied as a receive chain 1100, the amplifiers 1102-1106 may be embodied as low noise amplifiers 1102-1106. Although not illustrated, the amplification chain 110 may also include an attenuator and/or programmable gain stage configured to adjust the gain of the amplification chain 110, similar to the implementation illustrated in FIG. 7.

The chain 1100 is configured to receive a radio frequency input signal RF_IN and output a radio frequency output signal RF_OUT. Each of the amplifiers 1102-1106 can receive a shared reference voltage VDD and a corresponding enable signal EN1-EN3. The amplifiers 1102-1106 can be individually turned off or on to enable bias current calibration on the shared reference voltage VDD line. In some implementations, the reference voltage VDD line may further be shared by other stages or other circuitry within the FEIC.

The difference between all of the amplification stages 1102-1106 being disabled and one of the amplification stages 1102-1106 being enabled can provide a bias current of the enabled amplification stage 1102-1106, which can be used to accurately trim/calibrate the bias current and bias point of that particular enabled amplification stage 1102-1106. This calibration of the individual stages provides an advantage over more traditional calibration techniques in which the current of all amplification stages 1102-1106 change at once, making it more difficult to optimize for each amplification stage 1102-1106.

The calibration of an RF front end may involve the use of automated test equipment (ATE) to calibrate the gain of each transmit/receive chain. For example, calibration may involve: measuring the gain of the transmit/receive chain, adjust the coarse gain, fine tune the bias current of the output stage for a known output power for a transmit chain or for IP3 for a receive chain, and fine trimming a first stage for gain (e.g., for absolute gain or for gain matching between chains). In some embodiments, gain can be reduced by using a higher attenuation in the coarse adjustment or by reducing the stage bias current. In some embodiments, gain can be increased by increasing the bias current or lowering the coarse adjustment. Gain can also be adjusted by using a programmable gain stage using switchable periphery or switchable/programmable loads or topologies, depending on the embodiment.

Figure 9A:
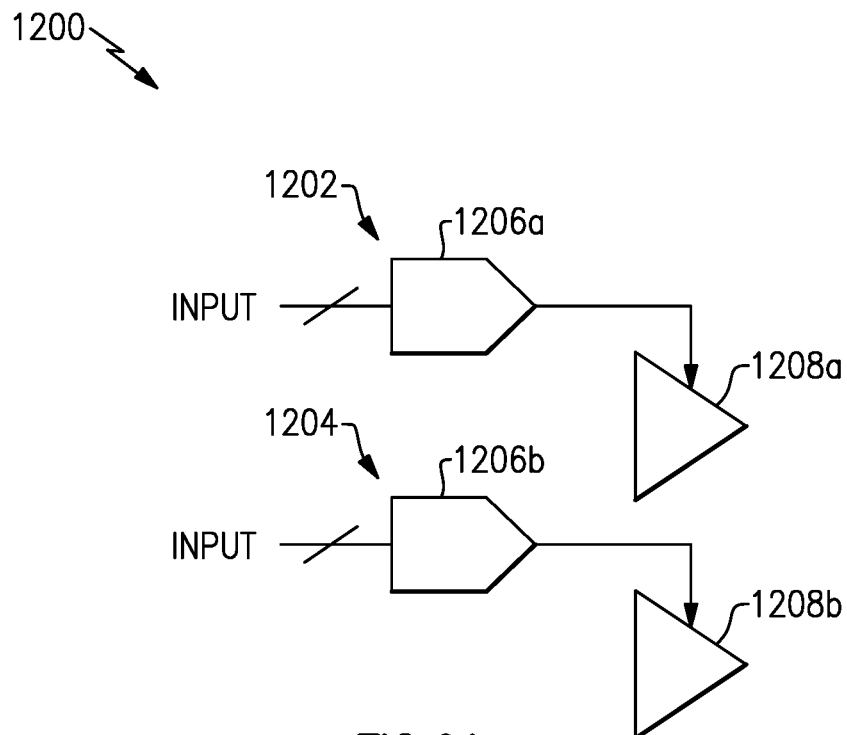
FIGS. 9A and 9B are schematic diagrams illustrating different embodiments of RF front ends including amplification chains in accordance with aspects of this disclosure.
Figure 9B:
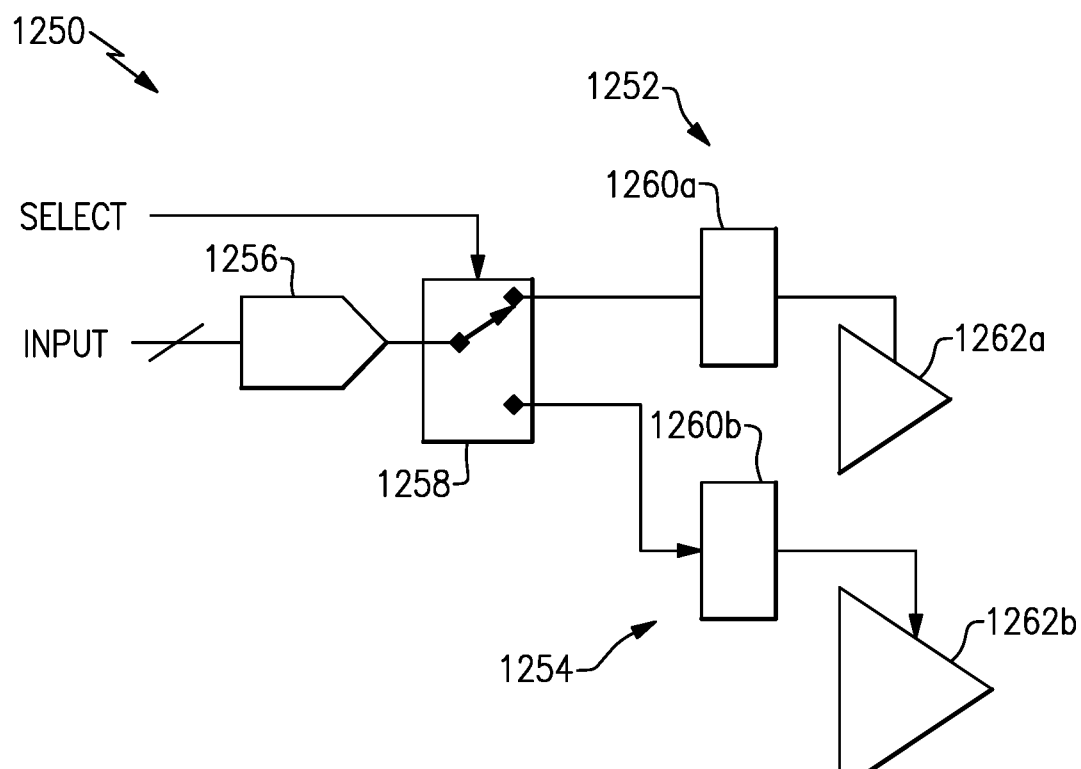

FIGS. 9A and 9B are schematic diagrams illustrating different embodiments of RF front ends 1200 and 1250 including amplification chains in accordance with aspects of this disclosure. In particular, FIG. 9A illustrates an embodiment including two independent amplification chains 1202 and 1204 and FIG. 9B illustrates an embodiment in which two amplification chains 1252 and 1254 receive input from a multiplexor. Although only two amplification chains 1202 and 1204 are illustrated in FIGS. 9A and 9B, aspects of this disclosure are not limited thereto and a greater or fewer number of amplification chains can be included in various implementations.

With reference to FIG. 9A, the RF front end 1200 includes a first amplification chain 1202 and a second amplification chain 1204. In one embodiment, the first and second amplification chains 1202 and 1204 may be configured to operate in different bands. However, in other embodiments, the first amplification chain 1202 may be configured as a transmit chain while the second amplification chain 1204 may be configured as a receive chain for the same band.

Each of the first and second amplification chains 1202 and 1204 includes a corresponding current DAC 1206a and 1206b and a corresponding amplifier 1208a and 1208b. Each of the current DACs 1206a and 1206b receives an input signal and generates a bias current which is provided to the corresponding amplifier 1208a and 1208b.

FIG. 9B illustrates an alternate embodiment in which a current DAC 1256 is shared between first and second amplification chains 1252 and 1254. The RF front end 1250 further includes a multiplexer 1258, first and second optional scaling blocks 1260a and 1260b, and first and second amplifiers 1262a and 1262b. Similar to the FIG. 9A embodiment, the first and second amplification chains 1252 and 1254 may be transmit chains which operate in different bands or may be transmit and receive chains which operate in the same band.

The multiplexer 1258 is configured to selectively apply the bias current output from the current DAC 1256 to one of the first and second amplifiers 1262a and 1262b. When included, the bias current can be scaled via the scaling blocks 1260a and 1260b.

The embodiment of FIG. 9B can be used for non-concurrent (e.g., TDD) multi-band solutions using different receive and TX chains, and can reuse of the same current DAC 1256 (e.g., bias generator) between the bands with current scaling performed by the scaling blocks 1260a and 1260b. In implementations that do not include the scaling blocks 1260a and 1260b, the bias current may be scaled inside a sizing/mirror within the amplifiers 1262a and 1262b or through an intermediate current mirror.

By sharing the current DAC 1256, the area occupied by the RF front end 1250 can be reduced (e.g., compared to the RF front end 1200 of FIG. 9A). The current DAC 1256 can also be shared by more than two amplification chains, resulting in even greater area savings. In addition, fewer digital traces can be used (e.g., the input lines to the current DAC 1256). For example, in FIG. 9B N input lines and one select line may be used to control the current DAC 1256 and the multiplexer, while in FIG. 9A, two times N input lines are used to provide the two inputs to the two current DACs 1206a and 1206b. A digital state machine (not illustrated) can be used to provide the correct input to the current DAC 1256 depending on the mode of operation of the RF front end (e.g., in transmit or receive mode, or depending on the current RF band being used for communication).

Another advantage to the use of a shared current DAC 1256 is that the RF front end 1250 can be more easily redesigned for more/less current by simply adjusting the scaling factor. This can be accomplished by adjusting the ratio of a current mirror or by metal mask adjustments alone. Thus, it can be easy to implement variants, derivatives, and/or adjustments.

The scaling blocks 1260a and 1260b (e.g., which may be a current mirror in some implementations) can be placed near the corresponding amplifiers 1262a and 1262b, which can enable: a smaller current DAC 1256 (e.g., by using lower current), resulting in better efficiency and a more compact size due to lower current handling. The smaller current DAC 1256 can be implemented with a supply different from the amplifiers 1262a and 1262b, enabling a smaller size, lower leakage etc. for the current DAC 1256. Additionally, the relative close placement of the scaling blocks 1260a and 1260b to the corresponding amplifiers 1262a and 1262b can also enable shorter traces with high current handling (e.g., the relatively higher current only needs to travel from the scaling block 1260a or 1260b to the corresponding amplifier 1262a or 1262b rather than from the current DAC 1256 to the amplifiers 1262a and 1262b), which may result in fewer issues of reliability and voltage drop across the lines, allows for the use thinner wires upstream of the scaling blocks 1260a and 1260b, and an overall smaller area for the RF front end 1250.

When the RF front end 1250 is used to implement TDD communication, the current DAC 1256 can be used to generate the bias current for transmit and receive chains 1262a and 1262b. The scaling blocks 1260a and 1260b can be used to scale the bias current, for example, using current mirrors. In other embodiments, current scaling can also be performed inside the power amplifier 1262a and low noise amplifier 1262b using sizing/mirror circuitry or through an intermediate mirror.

Similar to the use of the RF front end 1250 for two bands, in the transmit and receive TDD implementation, the area occupied by the RF front end 1250 due to the sharing of the single current DAC 1258 between the power amplifier 1262a and the low noise amplifier 1262b is reduced. Some or all of the other benefits described above in connection with the multi-band implementation (e.g., where the amplifiers 1262a and 1262b are power amplifiers used in two different bands) may also apply to the TDD implementation in which the first and second chains 1252 and 154 are transmit and receive chains for the same band.

Figure 10A:
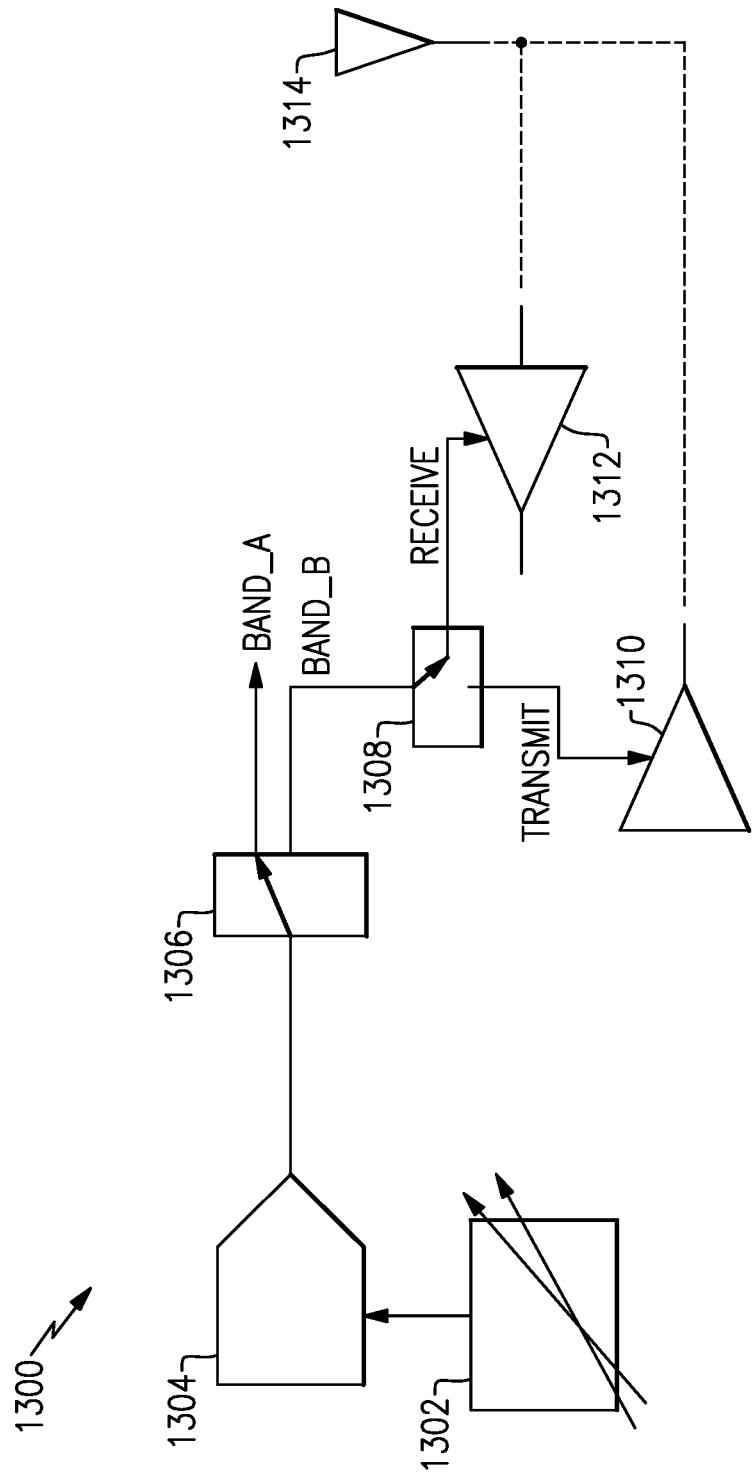

FIGS. 10A and 10B are schematic diagrams illustrating RF front ends 1300 and 1350 in accordance with aspects of this disclosure. In particular, FIG. 10A illustrates an embodiment which includes a plurality of 2:1 multiplexors 1306 and 1308 and FIG. 10A illustrates an embodiment which includes a single 4:1 multiplexor 1356.

With reference to FIG. 10A, the RF front end 1300 includes a control circuit 1302, a current DAC 1304, a first multiplexor 1306, a second multiplexor 1308, a power amplifier 1310, a low noise amplifier 1312, and an antenna 1314. In some embodiments, the control circuit 1302 includes a proportional to absolute temperature (PTAT) circuit or other bias circuit with predefined or programmable temperature, process, and supply dependence. The control circuit 1302 is configured to generate a digital control signal to control the level of the bias current generated by the current DAC 1304. Although not illustrated, the control circuit 1302 may further be configured to control the state of the multiplexors 1306 and 1308 such that the current output from the current DAC 1304 is provided to the intended amplifier (e.g., the power amplifier 1310 or the low noise amplifier 1312).

The first multiplexor 1306 is configured to selectively apply the bias current to one of a first band BAND_A and a second band BAND_B. Although not illustrated, the second multiplexor 1308, power amplifier 1310, low noise amplifier 1312, and antenna 1314 may be duplicated for the first band BAND_A. The second multiplexor 1308 is configured to selectively apply the bias current to one of the power amplifier 1310 and the low noise amplifier 1312. In some implementations, only one of the amplifiers 1310 and 1312 from both bands BAND_A and BAND_B may be operational at a given time, and thus, the multiplexors 1306 and 1308 may only need to provide the bias current to a single amplifier 1310 and 1312 at a given time.

With reference to FIG. 10B, the RF front end 1350 includes a control circuit 1352, a current DAC 1354, a multiplexor 1356, a power amplifier 1358, a low noise amplifier 1360, and an antenna 1362. In some embodiments, the control circuit 1302 includes a proportional to absolute temperature (PTAT) circuit or other bias circuit with predefined or programmable temperature, process and supply dependence. The control circuit 1302 is configured to generate a digital control signal to control the level of the bias current generated by the current DAC 1354. Although not illustrated, the control circuit 1302 may further be configured to control the state of the multiplexor 1356 such that the current output from the current DAC 1354 is provided to the intended amplifier (e.g., the power amplifier 1358 on BAND_B_TX, the low noise amplifier 1360 on BAND_B_RX, BAND_A_TX, or BAND_A_RX). In one embodiment, BAND_A may be 28 GHz and BAND_B may be 39 GHz.

As described herein, an RF front end (e.g., a millimeter wave FEIC) typically include a power amplifier and a low noise amplifier. The low noise amplifier typically operates at lower voltage than the power amplifier to leverage the better noise figure (NF) of the device with shorter gate length (and thus lower breakdown voltage). In contrast, the power amplifier typically operates at higher voltage to increase output power, the supply of which might be varied for Average Power Tracking (APT) or based on different platform/systems.

Using a common bias generator for the power amplifier and the low noise amplifier (e.g., as shown in FIGS. 10A and 10B) may involve operating with various output voltages. Accordingly, the 4:1 multiplexor 1356 of FIG. 10B may include an embedded cascode for voltage protection, enabling different possible supply voltages for the power amplifier 1358 and the low noise amplifier 1360.

The current DAC 1354 can be used to control the bias point of the power amplifier 1358 and the low noise amplifier 1360 for each stage (e.g., see FIGS. 7 and 8) included in the transmit or receive chain. In some implementations, the current of the amplifier may be calculated as the reference current multiplied by the digital input code (e.g., the control signal provided to the current DAC 1354) plus an offset. The reference current may be trimmed during production for each of the transmit and receive chains. The reference current may also be trimmed during production for each amplification stage individually. The reference current may also be trimmed during production for each band. Finally, the reference current may further be trimmed during production for temperature coefficient (e.g., in order to compensate for temperature variations), per amplification stage, per band, and per mode (e.g., transmit and receive). The offset can also be trimmed similarly to the reference current per amplification stage, per band, and per mode.

The trimming of the reference current and the offset can be performed individually for each channel within the FEIC. Certain parameters can be shared/trimmed similarly between channels or between stages. For instance, the temperature coefficient of a given amplification stage may be substantially the same for each channel. Thus, the trimming of the temperature coefficient can be shared between different bands and transmit/receive chains.

The power amplifiers used for millimeter wave frequencies may be comparatively inefficient compared to other frequencies, and thus, the junction temperature rise for the power amplifiers can be significant. Thus, maintaining performance over temperature variations can involve proper temperature compensation of both the power amplifier and low noise amplifier bias current bias as well as other bias voltages such as cascodes.

Since the different amplification stages of the power amplifier and low noise amplifier chains are biased in different regions (e.g., operation classes) to achieve different performance optimization targets (lower NF, high linearity, gain expansion, gain compression etc.), the optimum temperature coefficient can vary from stage to stage and be difficult to identify by simulation alone. Aspects of this disclosure enable programming and trimming/fusing of the temperature coefficient for each individual amplification stage for each transmit and receive chain, as well as per band and/or per channel. Aspects of this disclosure further enable reprogramming and trimming using a shared/reusable bias generator, such as the current DACs 1304 and 1354.

Figure 11:
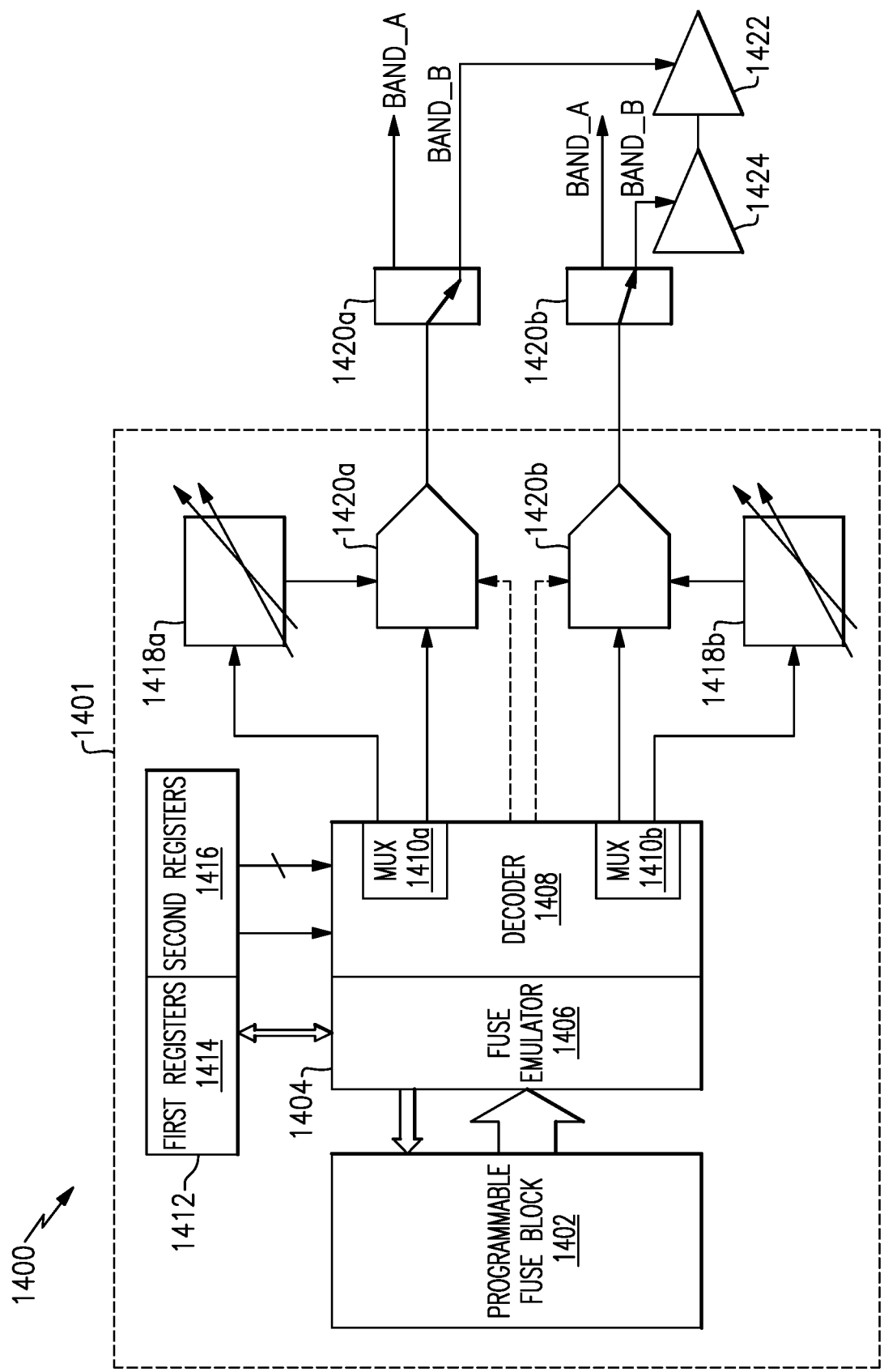
FIG. 11 is a schematic diagram illustrating another RF front end in accordance with aspects of this disclosure.

FIG. 11 is a schematic diagram illustrating another RF front end embodiment 1400 in accordance with aspects of this disclosure. With reference to FIG. 11, the RF front end 1400 includes a control circuit 1401 including programmable fuse block 1402, controller 1404, a mobile industry processor interface (MIPI) or other serial or parallel interface 1412, a first control circuit 1418a, a second control circuit 1418b, a first current DAC 1420a, a second current DAC 1420b. The RF front end 1400 further includes a first multiplexor 1420a, a second multiplexor 1420b, a first amplifier 1422, and a second amplifier 1424.

The controller 1404 includes a fuse emulator 1406, a decoder 1408, a third multiplexor 1410a, and a fourth multiplexor 1410b. The MIPI 1412 includes a first set of registers 1414 which may not be reprogrammable and a second set of registers 1416 which may be reprogrammable.

The fuse block 1402 may be a one time programmable fuse block 1402 and can be configured to include digital control values for each stage and each band for both the transmit and receive chains of the RF front end. For example, the fuse block 1402 can store digital control signals for bias trim (e.g., bias current), temperature coefficient, and various bias shaping. The fuse emulator 1406 is configured to receive the digital codes form the fuse block 1402 based on control signals received from the MIPI 1412. The decoder 1408 can be configured to decode the digital control signals received from the fuse block 1402 into values to be provided to the control circuits 1418a and 1418b and the current DACs 1420a and 1420b via the third and fourth multiplexors 1410a and 1410b.

The first amplifier 1422 may form a first amplification stage (e.g., for a transmit chain) and the second amplifier 1424 may form a second amplification stage for the transmit chain. In other embodiments, the first and second amplifiers may provide amplification stages for a receive chain.

The first amplifier 1422 can receive a bias current via the first control circuit 1418a, the first current DAC 1420a, and the first multiplexor 1420a. Similarly, the second amplifier 1424 can receive a bias current via the second control circuit 1418b, the second current DAC 1420b, and the second multiplexor 1420b. Thus, both amplification stages can receive bias currents simultaneously.

In more detail, the first and second multiplexors 1410a and 1410b, together with the decoder 1408, provide digital codes to the shared control circuits 1418a and 1418b as well as to the current DACs 1420a and 1420b. The control circuits 1418a and 1418b may be implemented as PTAT circuits and may receive digital values indicative of the temperature coefficient and a reference or nominal temperature value (e.g., a reference value for a temperature of 25° C.). The digital control signals provided to the current DACs 1420a and 1420b may include a DAC setting value and any offset or shaping control signals.

In order to calibrate the bias currents, the bias current can first be optimized for room temperature, and then the RF front end can be heated to find an optimal value for the temperature coefficient. Alternatively, the temperature optimization can be performed through lab characterization and the optimum result programmed into the RFIC during production test.

In some embodiments, the reference current trimming resolution (e.g., number of bits used to encode the digital control values) may vary between the type of chain (e.g., dependent on whether the chain is a receive or transmit chain). In one example, the trimming resolution may be 3 bits for a receive chain and 5 bits for a transmit chain.

In some embodiments, the reference current can be trimmed per channel, per receive/transmit chain, per band, and/or per amplification stage. The temperature coefficient can also be trimmed per stage, per band, and per receive/transmit chain.

The reference currents (e.g., bias current) can also be trimmable for value (e.g., to correct process variation, mismatch between channels, and/or simply to achieve a desired new target for optimization), offsets, and temperature coefficient.

At room temperature (e.g., 30° C. for the die or any other value set as room temperature), the temperature coefficient adjustment may not alter the nominal bias current to simplify calibration.

The control circuit 1401 is configured to control and production trim (e.g., calibrate) the bias current per band, per mode (e.g., receive and transmit modes), per channel, and/or per amplification stage. Each amplification stage can be fully turned off to enable current measurement of each amplification stage on a shared supply, thereby simplifying calibration for each amplification stage. The calibration coefficients will be stored in a memory, either a One-Time-Programmable (OTP) or Multiple Time programmable (MTP) Memory or other non-volatile memory during production test. The content of this look-up table can be overwritten to emulate/try out particular coefficients before measuring the results.

The bias DAC can be shared between bands and/or modes (e.g., receive and transmit modes) simultaneously to save area, reduced routing complexity, reduce power consumption, increase reliability, and provide additional design flexibility.

The bias point for each amplifier 1422 and 1424 can be fully controlled at the individual amplification stage level (e.g., using the current DAC 1420a and 1420b settings). The bias point for each amplifier 1422 and 1424 can also be fully controlled at the chain level (e.g., using the current DAC 1420a and 1420b settings), with integrated trimmable shaping between each amplification stage. The equation used to generate the bias current for each stage can be based on a general control parameter.

Although the FIG. 11 implementation illustrates bias current control for two amplification stages for two bands, the control circuitry 1401 can be scaled to provide bias current to additional channels. Aspects of this disclosure provide for increased area efficiency by sharing the bias current generators (e.g., current DACs) by multiplexing between frequency bands and modes (e.g., receive and transmit modes), including current biasing blocks, voltage biasing blocks, and digital control buses. The different amplifiers can be fully trimmable at the individual amplification stage level to achieve gain matching between channels. The amplifiers can also be trimmed for temperature coefficient, independently of the room temp absolute bias calibration.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front end system comprising:
a plurality of front end amplification chains including transmit and receive chains for at least two radio frequency bands, each of the front end amplification chains configured to either transmit or receive radio frequency signals via one of a plurality of antennas, and each of the front end amplification chains further including an amplifier configured to amplify the corresponding radio frequency signal;
a control circuit configured to generate a bias current; and
a multiplexor configured to receive the bias current from the control circuit and provide the bias current to a selected one of the amplifiers.

2. The front end system of claim 1 wherein the antennas, the front end amplification chains, the control circuit, and the multiplexor are all formed on a single die.

3. The front end system of claim 1 wherein each of the front end amplification chains is configured to transmit or receive the radio frequency signals in a millimeter wave spectrum or a TeraHertz spectrum.

4. The front end system of claim 1 wherein each of the front end amplification chains is configured to transmit or receive the radio frequency signals in a 5G spectrum.

5. The front end system of claim 1 wherein the control circuit includes a current digital-to-analog converter configured to receive a digital reference current value and generate the bias current based on the digital reference current value.

6. The front end system of claim 5 wherein the control circuit includes a shared bias generator circuit configured to receive a trim bias current value and a temperature coefficient and generate the digital reference current value based on the trim bias current value and the temperature coefficient.

7. The front end system of claim 5 wherein the control circuit includes a shared bias generator circuit configured to receive a trim bias current value and generate the digital reference current value based on the trim bias current value.

8. The front end system of claim 1 wherein each of the front end amplification chains includes a plurality of amplification stages, wherein the bias current includes a plurality of bias currents, each of the bias currents corresponding to one of the plurality amplification stages, and wherein the multiplexor includes a plurality of multiplexors, each of the plurality of multiplexors configured to receive the bias currents for a corresponding one of the amplification stages and provide the bias currents to the corresponding amplification stages of each of the front end amplification chains.

9. The front end system of claim 1 wherein the control circuit is further configured to generate the bias current based on a temperature coefficient and a trim bias current.

10. The front end system of claim 1 wherein each of the front end amplification chains includes an attenuator or a programmable gain stage configured to adjust the gain of the corresponding front end amplification chain.

11. A radio frequency device comprising:
a plurality of antennas; and
a front end system including a plurality of front end amplification chains including transmit and receive chains for at least two radio frequency bands, each of the front end amplification chains configured to either transmit or receive radio frequency signals via one of the plurality of antennas, and each of the front end amplification chains includes an amplifier configured to amplify the corresponding radio frequency signal, a control circuit configured to generate a bias current, and a multiplexor configured to receive the bias current from the control circuit and provide the bias current to a selected one of the amplifiers.

12. The radio frequency device of claim 11 wherein the antennas, the front end amplification chains, the control circuit, and the multiplexor are all formed on a single die.

13. The radio frequency device of claim 11 wherein each of the front end amplification chains is configured to transmit or receive the radio frequency signals in a millimeter wave spectrum or a TeraHertz spectrum.

14. The radio frequency device of claim 11 wherein each of the front end amplification chains is configured to transmit or receive the radio frequency signals in a 5G spectrum.

15. The radio frequency device of claim 11 wherein the control circuit includes a current digital-to-analog converter configured to receive a digital reference current value and generate the bias current based on the digital reference current value.

16. The radio frequency device of claim 15 wherein the control circuit includes a shared bias generator circuit configured to receive a trim bias current value and a temperature coefficient and generate the digital reference current value based on the trim bias current value and the temperature coefficient.

17. The radio frequency device of claim 11 wherein each of the front end amplification chains includes a plurality of amplification stages, wherein the bias current includes a plurality of bias currents, each of the bias currents corresponding to one of the plurality amplification stages, and wherein the multiplexor includes a plurality of multiplexors, each of the plurality of multiplexors configured to receive the bias currents for a corresponding one of the amplification stages and provide the bias currents to the corresponding amplification stages of each of the front end amplification chains.

18. The radio frequency device of claim 11 wherein the control circuit is further configured to generate the bias current based on a temperature coefficient and a trim bias current.

19. The radio frequency device of claim 11 comprising one of the following: a telecommunications device, a telecommunications satellite, a base station, a mobile device, and a radar device.

20. A method comprising:
generating, at a control circuit, a bias current;
receiving the bias current at a multiplexor, the multiplexor and control circuit formed on a front end system including a plurality of front end amplification chains including transmit and receive chains for at least two radio frequency bands, each of the front end amplification chains configured to either transmit or receive radio frequency signals via one of a plurality of antennas, and each of the front end amplification chains includes an amplifier configured to receive the bias current and amplify the corresponding radio frequency signal; and providing, by the multiplexor, the bias current to the amplifier of a selected one of the plurality of front end amplification chains.

\* \* \* \* \*